(12) United States Patent
Yamauchi et al.

(10) Patent No.: US 7,843,407 B2
(45) Date of Patent: Nov. 30, 2010

(54) ELECTRONIC DEVICE AND ELECTRONIC APPARATUS

(75) Inventors: Yukio Yamauchi, Shizuoka (JP);
Takeshi Fukunaga, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 660 days.

(21) Appl. No.: 11/860,262

(22) Filed: Sep. 24, 2007

(65) Prior Publication Data
US 2008/0018566 A1    Jan. 24, 2008

Related U.S. Application Data

(60) Continuation of application No. 11/085,038, filed on Mar. 22, 2005, now Pat. No. 7,274,349, and a division of application No. 10/337,391, filed on Jan. 7, 2003, now Pat. No. 6,879,309, and a division of application No. 09/551,866, filed on Apr. 18, 2000, now Pat. No. 6,512,504.

(30) Foreign Application Priority Data

Apr. 27, 1999  (JP) .................................. 11-119466

(51) Int. Cl.
*G09G 3/30* (2006.01)
(52) U.S. Cl. ....................................................... 345/76
(58) Field of Classification Search ................... 345/76, 345/206, 92; 257/448, 92; 313/500, 503, 313/504, 506, 509
See application file for complete search history.

(56) References Cited

U.S. PATENT DOCUMENTS

| 4,925,807 A | 5/1990 | Yoshikawa |
| 4,996,523 A | 2/1991 | Bell et al. |
| 5,003,356 A * | 3/1991 | Wakai et al. ................ 257/390 |

(Continued)

FOREIGN PATENT DOCUMENTS

EP        0544229 A1   6/1993

(Continued)

OTHER PUBLICATIONS

Hatano et al., "A Novel Self-aligned Gate-overlapped LDD Poly-Si TFT with High Reliability and Performance", pp. 523-526, 1997, IEDM Technical Digest 97.

(Continued)

*Primary Examiner*—Richard Hjerpe
*Assistant Examiner*—Shaheda A Abdin
(74) *Attorney, Agent, or Firm*—Nixon Peabody LLP; Jeffrey L. Costellia

(57) ABSTRACT

An EL display having high operating performance and reliability is provided. LDD regions 15a through 15d of a switching TFT 201 formed in a pixel are formed such that they do not overlap gate electrodes 19a and 19b to provide a structure which is primarily intended for the reduction of an off-current. An LDD region 22 of a current control TFT 202 is formed such that it partially overlaps a gate electrode 35 to provide a structure which is primarily intended for the prevention of hot carrier injection and the reduction of an off-current. Appropriate TFT structures are thus provided depending on required functions to improve operational performance and reliability.

24 Claims, 14 Drawing Sheets

U.S. PATENT DOCUMENTS

| | | | |
|---|---|---|---|
| 5,173,792 A * | 12/1992 | Matsueda | 349/54 |
| 5,247,190 A | 9/1993 | Friend et al. | |
| 5,254,490 A | 10/1993 | Kondo | |
| 5,302,966 A | 4/1994 | Stewart | |
| 5,323,042 A | 6/1994 | Matsumoto | |
| 5,399,502 A | 3/1995 | Friend et al. | |
| 5,499,123 A | 3/1996 | Mikoshiba | |
| 5,594,569 A | 1/1997 | Konuma et al. | |
| 5,643,826 A | 7/1997 | Ohtani et al. | |
| 5,684,365 A * | 11/1997 | Tang et al. | 315/169.3 |
| 5,706,064 A | 1/1998 | Fukunaga et al. | |
| 5,712,495 A | 1/1998 | Suzawa | |
| 5,729,308 A | 3/1998 | Yamazaki et al. | |
| 5,777,335 A | 7/1998 | Mochizuki et al. | |
| 5,790,213 A | 8/1998 | Sasaki et al. | |
| 5,828,429 A | 10/1998 | Takemura | |
| 5,856,689 A | 1/1999 | Suzawa | |
| 5,895,935 A | 4/1999 | Yamazaki et al. | |
| 5,923,962 A | 7/1999 | Ohtani et al. | |
| 5,952,789 A | 9/1999 | Stewart et al. | |
| 5,998,841 A | 12/1999 | Suzawa | |
| 6,023,308 A | 2/2000 | Takemura | |
| 6,025,607 A | 2/2000 | Ohori et al. | |
| 6,049,092 A | 4/2000 | Konuma et al. | |
| 6,093,937 A | 7/2000 | Yamazaki et al. | |
| 6,111,270 A | 8/2000 | Xu et al. | |
| 6,127,210 A | 10/2000 | Mimura et al. | |
| 6,160,272 A | 12/2000 | Arai et al. | |
| 6,166,397 A | 12/2000 | Yamazaki et al. | |
| 6,198,133 B1 | 3/2001 | Yamazaki et al. | |
| 6,229,506 B1 | 5/2001 | Dawson et al. | |
| 6,246,179 B1 | 6/2001 | Yamada | |
| 6,246,384 B1 | 6/2001 | Sano | |
| 6,274,887 B1 | 8/2001 | Yamazaki et al. | |
| 6,281,552 B1 | 8/2001 | Kawasaki et al. | |
| 6,297,862 B1 | 10/2001 | Murade | |
| 6,310,670 B1 | 10/2001 | Lee | |
| 6,331,723 B1 | 12/2001 | Yamazaki et al. | |
| 6,365,917 B1 | 4/2002 | Yamazaki | |
| 6,392,628 B1 | 5/2002 | Yamazaki et al. | |
| 6,469,317 B1 | 10/2002 | Yamazaki et al. | |
| 6,507,069 B1 | 1/2003 | Zhang et al. | |
| 6,512,504 B1 | 1/2003 | Yamauchi et al. | |
| 6,518,594 B1 | 2/2003 | Nakajima et al. | |
| 6,518,941 B1 | 2/2003 | Kimura | |
| 6,531,713 B1 | 3/2003 | Yamazaki | |
| 6,542,137 B2 | 4/2003 | Kimura et al. | |
| 6,593,592 B1 | 7/2003 | Yamazaki et al. | |
| 6,617,644 B1 | 9/2003 | Yamazaki et al. | |
| 6,714,183 B2 | 3/2004 | Yamazaki et al. | |
| 6,724,149 B2 | 4/2004 | Komiya et al. | |
| 6,765,552 B2 | 7/2004 | Yamazaki et al. | |
| 6,773,971 B1 | 8/2004 | Zhang et al. | |
| 6,777,255 B2 | 8/2004 | Yamazaki | |
| 6,781,155 B1 | 8/2004 | Yamada | |
| 6,794,675 B1 | 9/2004 | Suzuki et al. | |
| 6,812,490 B2 | 11/2004 | Takehashi et al. | |
| 6,815,273 B2 | 11/2004 | Nakajima et al. | |
| 6,879,309 B2 | 4/2005 | Yamauchi et al. | |
| 6,909,114 B1 | 6/2005 | Yamazaki | |
| 6,940,214 B1 | 9/2005 | Komiya et al. | |
| 6,949,767 B2 | 9/2005 | Yamazaki | |
| 6,955,953 B2 | 10/2005 | Yamazaki et al. | |
| 7,022,556 B1 | 4/2006 | Adachi | |
| 7,172,928 B2 | 2/2007 | Yamazaki | |
| 7,236,164 B2 | 6/2007 | Kimura | |
| 7,244,962 B2 | 7/2007 | Nakajima et al. | |
| 7,259,427 B2 | 8/2007 | Yamazaki et al. | |
| 7,279,711 B1 | 10/2007 | Yamazaki et al. | |
| 2001/0054991 A1 | 12/2001 | Kimura et al. | |
| 2003/0062499 A1 | 4/2003 | Yamazaki | |
| 2003/0076046 A1 | 4/2003 | Komiya et al. | |
| 2003/0090214 A1 | 5/2003 | Kimura et al. | |
| 2003/0100152 A1 | 5/2003 | Konuma et al. | |
| 2004/0065902 A1 | 4/2004 | Yamazaki et al. | |
| 2004/0256621 A1 | 12/2004 | Konuma et al. | |
| 2004/0266042 A1 | 12/2004 | Yamazaki | |
| 2005/0100832 A1 | 5/2005 | Adachi | |
| 2005/0104068 A1 | 5/2005 | Yamazaki | |
| 2006/0051906 A1 | 3/2006 | Yamazaki | |
| 2006/0081931 A1 | 4/2006 | Yamazaki et al. | |
| 2006/0091387 A1 | 5/2006 | Yamazaki | |
| 2006/0097256 A1 | 5/2006 | Yamazaki et al. | |
| 2007/0210312 A1 | 9/2007 | Nakajima et al. | |
| 2008/0048189 A1 | 2/2008 | Yamazaki et al. | |

FOREIGN PATENT DOCUMENTS

| | | |
|---|---|---|
| EP | 0 645 802 A2 | 3/1995 |
| EP | 0863495 A1 | 9/1998 |
| EP | 0 949 603 A1 | 10/1999 |
| JP | 02-012836 | 1/1990 |
| JP | 04-326524 | 11/1992 |
| JP | 04-369271 | 12/1992 |
| JP | 05-072555 | 3/1993 |
| JP | 05-095115 | 4/1993 |
| JP | 05-102483 | 4/1993 |
| JP | 05-142577 | 6/1993 |
| JP | 05-206463 | 8/1993 |
| JP | 07-130652 | 5/1995 |
| JP | 08-032080 | 2/1996 |
| JP | 08-330602 | 12/1996 |
| JP | 09-045930 | 2/1997 |
| JP | 09-166788 | 6/1997 |
| JP | 09-293879 | 11/1997 |
| JP | 10-092576 | 4/1998 |
| JP | 10-189998 | 7/1998 |
| JP | 10-270363 | 10/1998 |
| JP | 10-319872 | 12/1998 |
| JP | 10-319908 | 12/1998 |
| JP | 11-045999 | 2/1999 |
| JP | 11-073158 | 3/1999 |
| JP | 2000/214800 | 8/2000 |
| JP | 2000/242196 | 9/2000 |
| JP | 2000-340798 | 12/2000 |
| WO | WO 90/13148 | 11/1990 |
| WO | WO-98/13811 | 4/1998 |
| WO | WO 98/48403 A1 | 10/1998 |

OTHER PUBLICATIONS

Schenk et al., "Polymers for Light Emitting Diodes", pp. 33-37, 1999, EuroDisplay '99 Proceedings.

Furue et al., "Characteristics and Driving Scheme of Polymer-Stabilized Monostable FLCD Exhibiting Fast Response Time and High Contrast Ratio with Gray-Scale Capability", pp. 782-785, 1998, SID 98 Digest.

Yoshida et al., "A Full-Color Thresholdness Antiferroelectric LCD Exhibiting Wide Viewing Angle with Fast Response Time", pp. 841-844, 1997, SID 97 Digest.

Shimokawa et al., "Characterization of High-Efficiency Cast-Si Solar Cell Wafers by MBIC Measurement", pp. 751-758, May 1998, Japanese Journal of Applied Physics, vol. 27, No. 5.

European Search Report (European Application No. 00108848.3) dated Apr. 11, 2005.

* cited by examiner

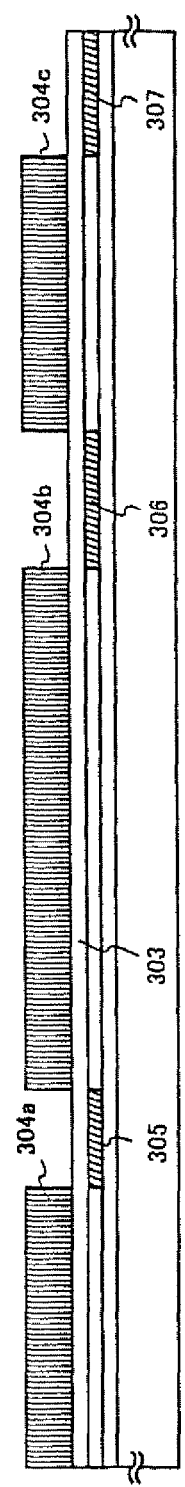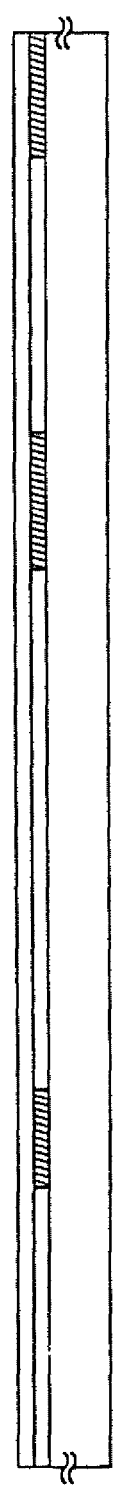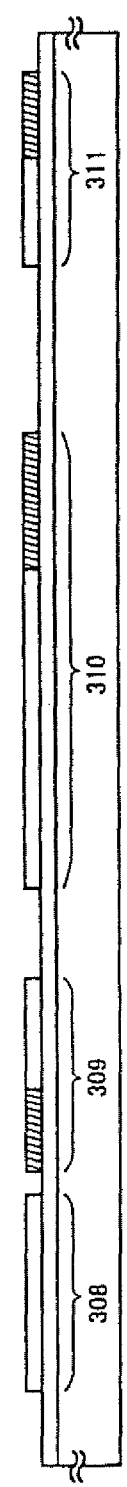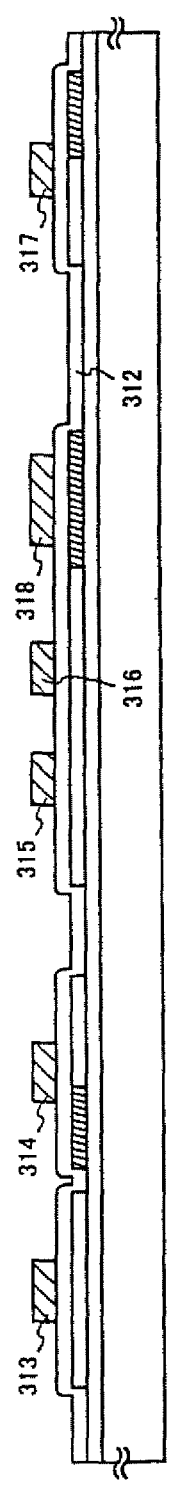

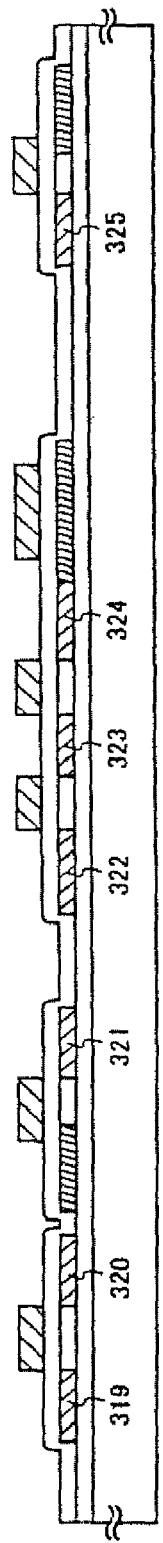
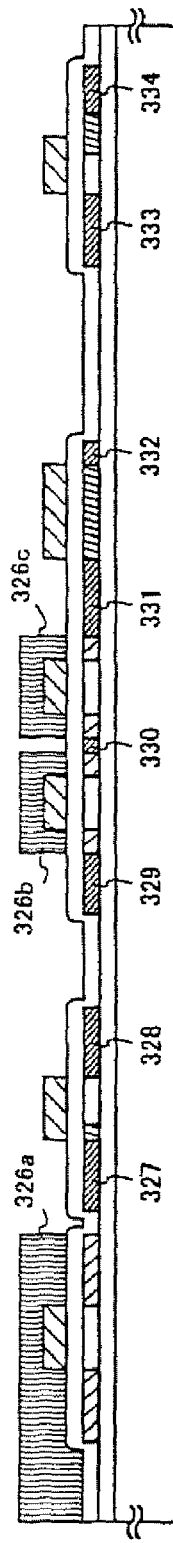
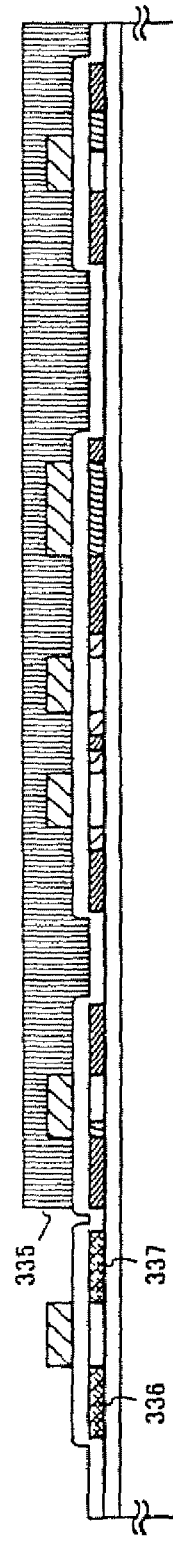
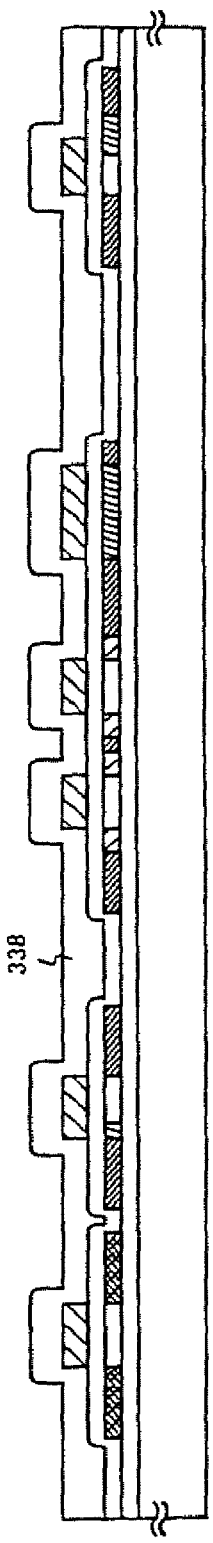
Fig. 4A
Fig. 4B
Fig. 4C
Fig. 4D

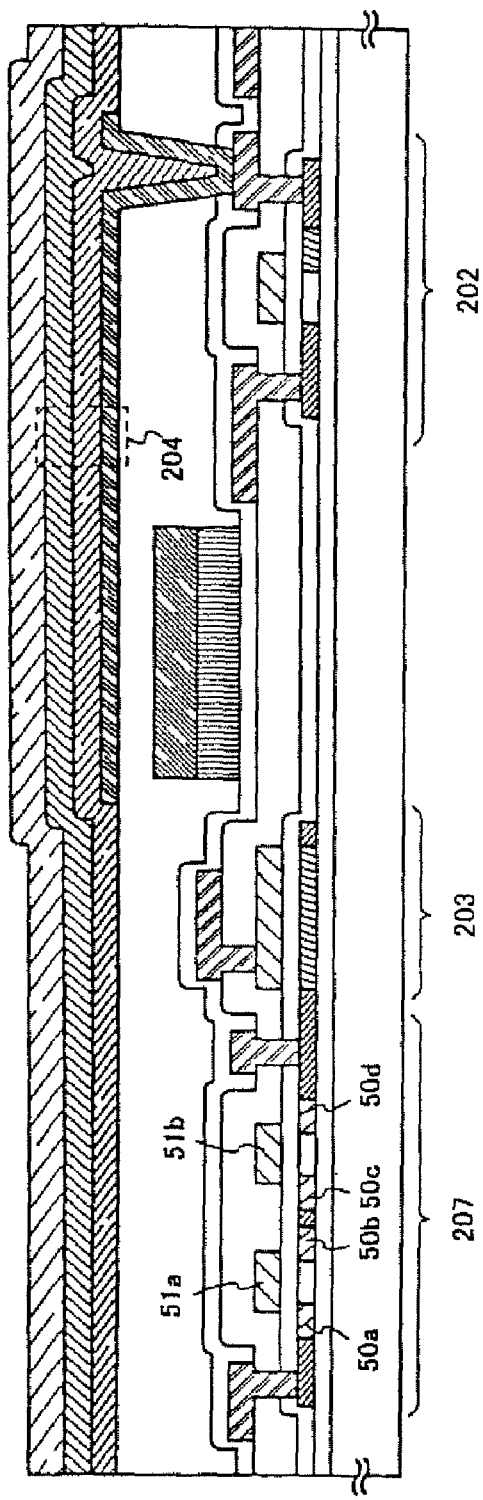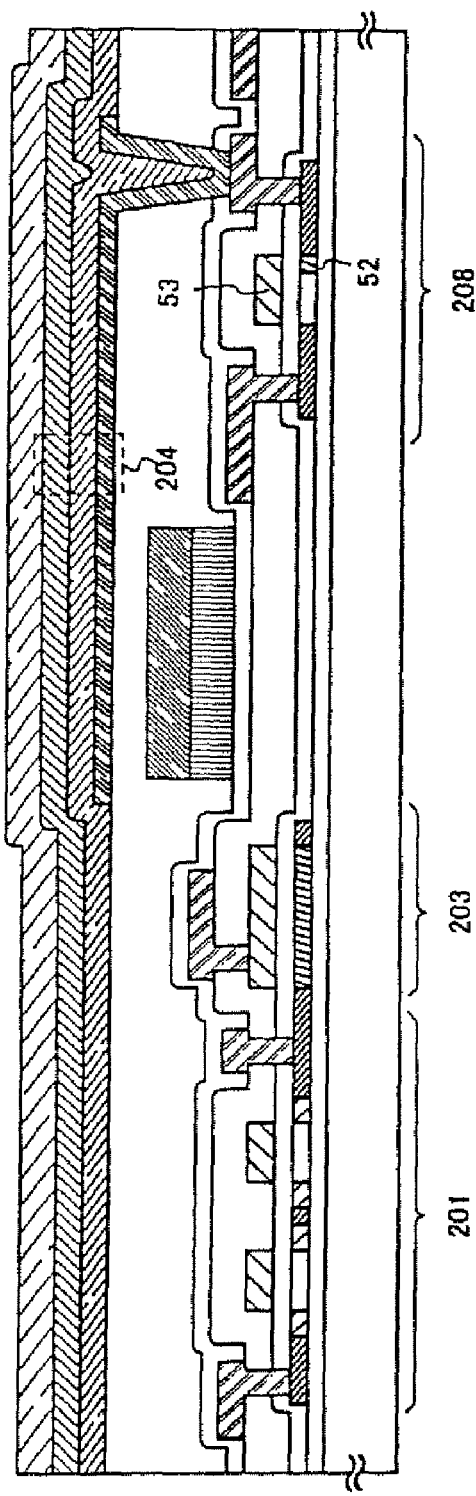

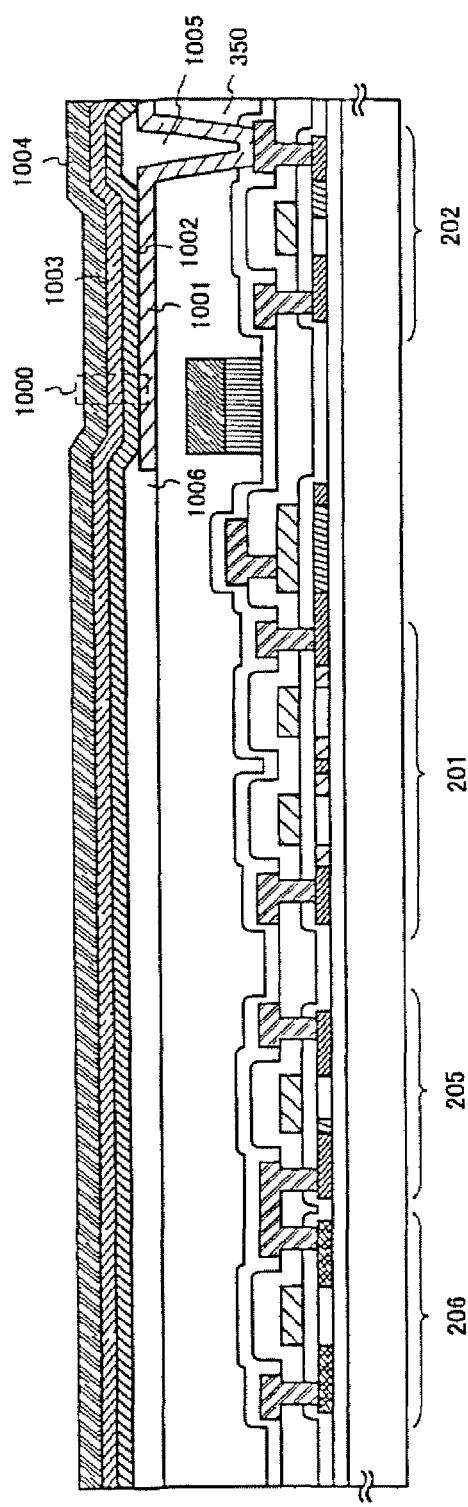
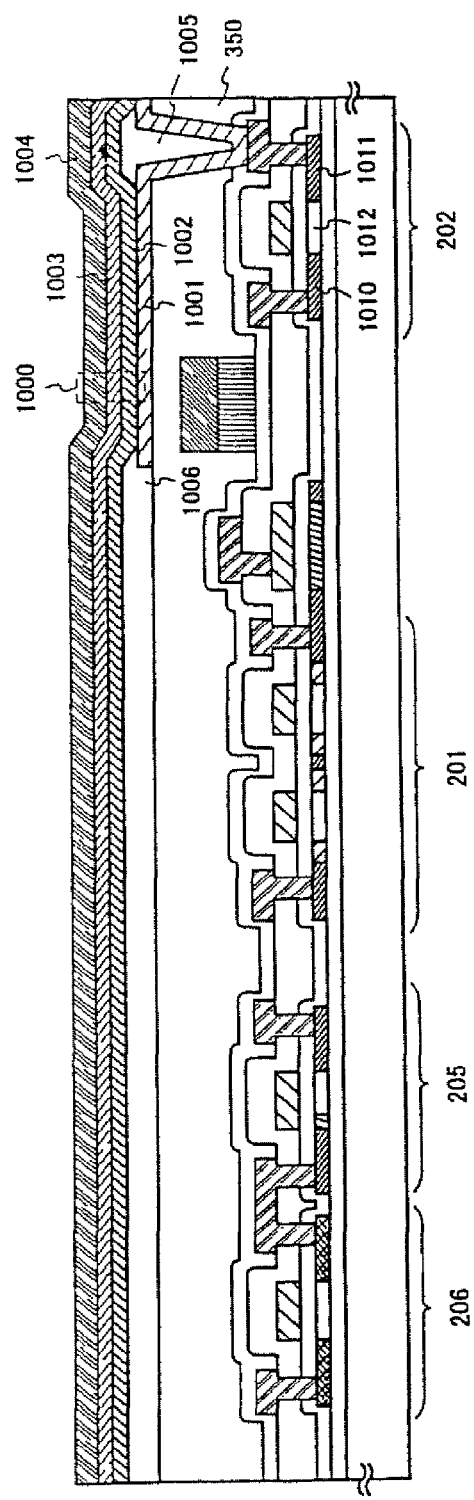
Fig. 10A
Fig. 10B

US 7,843,407 B2

ELECTRONIC DEVICE AND ELECTRONIC APPARATUS

BACKGROUND OF THE INVENTION

1. Field of the Invention

The present invention relates to an electronic device formed by fabricating a semiconductor element (element utilizing a semiconductor thin film) on a substrate and an electronic apparatus utilizing such an electronic device as a display portion. Particularly, the present invention is a technique which is advantageously embodied in an active matrix EL (electroluminescence) display which is an electronic device.

2. Description of the Related Art

Recently, great advances have been made in techniques for forming TFTs on a substrate, and application of the same to the development of active matrix displays is in progress. Especially, TFTs utilizing polysilicon films are capable of operations at a high speed because they have higher field effect mobility compared to conventional TFTs utilizing amorphous silicon films. This has made it possible to control pixels with a driving circuit formed on the same substrate (insulator) on which the pixels are formed unlike the prior art in which pixels have been controlled by a driving circuit outside the substrate.

Such active matrix displays are presently attracting attentions for various advantages including compactness of the displays, improved yield and reduced throughput attributable to the fact that various circuits and elements are fabricated on the same substrate.

Various circuits and element portions having various functions are formed on the substrate of an active matrix display. Therefore, when elements are formed of TFTs, the TFTs are required to have different performance depending on the respective circuits and elements. For example, TFTs operating at a high speed are required for shift registers for generating a timing signal and the like, and TFTs having a sufficiently low off-current (a drain current that flows when a TFT is off) are required for switching elements for accumulating electrical charges.

In such a case, it is difficult to maintain performance requirements of all circuits or elements only with TFTs having the same structure, which can be a serious obstacle to efforts toward improved performance of active matrix displays.

It is an object of the invention to provide an active matrix type electronic device having a pixel portion and driving circuit portions provided on the same insulator, in which TFTs having appropriate structures are used depending on performance required for circuits or elements formed by the TFTs to provide high operating performance and reliability.

It is another object of the invention to improve the quality of images on an electronic device (particularly, an active matrix type EL display), thereby improving the quality of an electronic apparatus utilizing the same as a display portion.

SUMMARY OF THE INVENTION

In order to achieve the above-described objects, a principle of the present invention is that TFTs having optimum structures are allocated to each pixel of an EL display taking in view of the elements included in the pixel. That is, TFTs having different structures are present in the same pixel.

Specifically, TFT structures oriented toward lower off-currents rather than higher operating speeds are preferable for elements for which a sufficiently low off-current is the most important requirement (switching elements and the like). For elements through which a high current must flow as the top priority, it is preferable to use TFT structures oriented toward flow of high currents and suppression of very much problematic deterioration attributable to injection of hot carriers rather than the reduction of the off-current.

The present invention makes it possible to improve operating performance and reliability of an EL display by using different TFTs appropriately on the same insulator. The principle of the present invention is characterized in that TFT structures are optimized not only in a pixel portion but also in driving circuit portions for driving the pixel portion.

BRIEF DESCRIPTION OF THE DRAWINGS

FIGS. 3A through 3E show steps for fabricating an active matrix EL display.

FIGS. 4A through 4D show steps for fabricating an active matrix EL display.

FIGS. 6A and 6B show sectional structures of a pixel portion of an EL display.

FIGS. 10A and 10B shows a sectional structure of a pixel portion of an EL display.

DETAILED DESCRIPTION OF PREFERRED EMBODIMENTS

Figure 1:
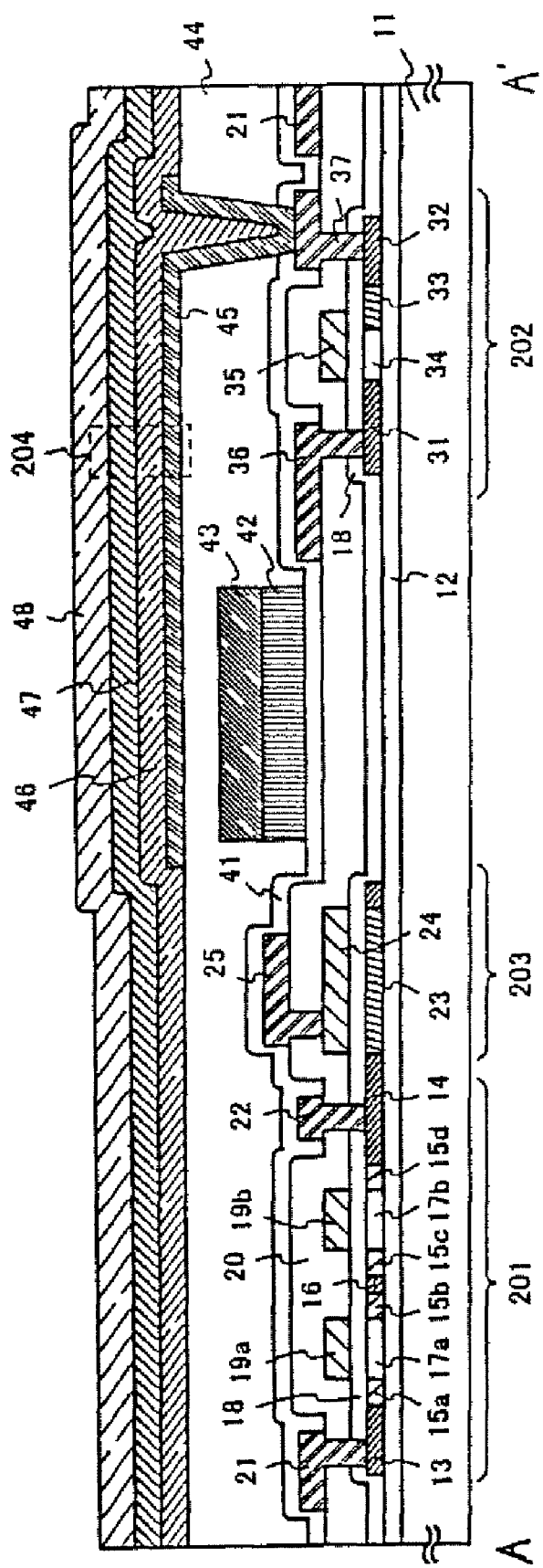
FIG. 1 shows a sectional structure of a pixel portion of an EL display.
Figure 2A:
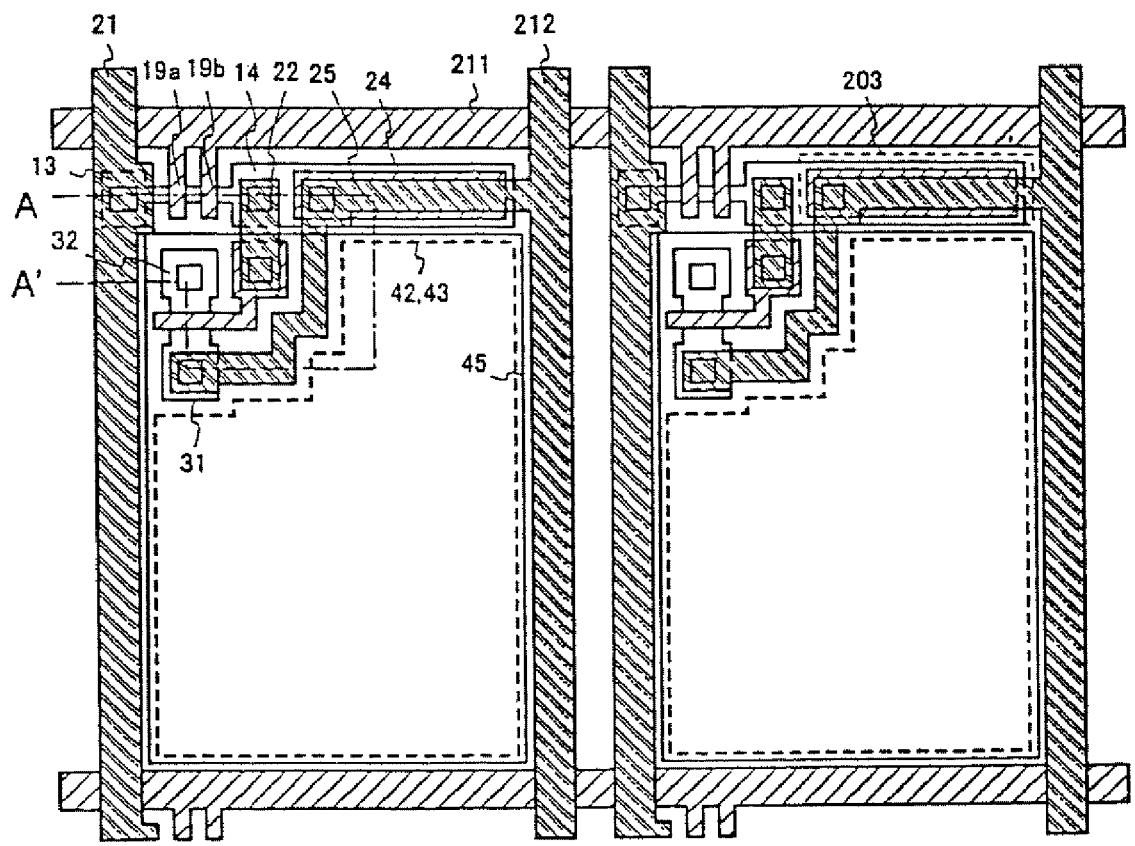
FIGS. 2A and 2B show a top surface structure of the pixel portion of the EL display.
Figure 2B:
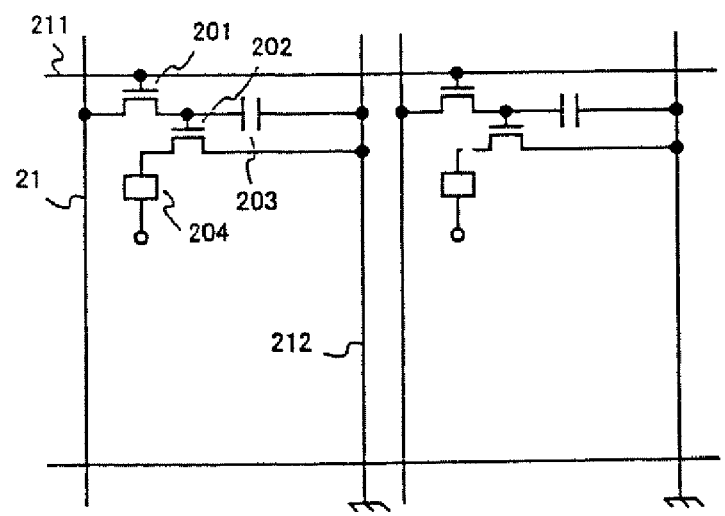

A preferred embodiment of the invention will now be described with reference to FIGS. 1 and 2. FIG. 1 is a sectional view of a pixel of an EL display according to the invention. FIG. 2A is a plan view of the same, and FIG. 2B shows a circuit configuration of the same. In practice, a plurality of such pixels are arranged in the form of a matrix to form a pixel portion (image display portion).

The sectional view of FIG. 1 shows a section along the line A-A' in the plan view of FIG. 2A. Since common reference numbers are used in FIGS. 1, 2A and 2B, those figures may be cross-referred appropriately. While the plan view in FIG. 2A shows two pixels, they have the same structure.

In FIG. 1, 11 represents a substrate, and 12 represents an underlying film (insulator). The substrate 11 may be a glass substrate, glass-ceramics substrate, quartz substrate, silicon substrate, ceramics substrate, metal substrate or plastic substrate (including a plastic film).

While the underlying film 12 is advantageous especially when a substrate including mobile ions or a conductive substrate is used, it may be omitted for a quartz substrate. An insulation film including silicon may be provided as the underlying film 12. In the present specification, the term "insulation film including silicon" specifically implies an insulation film such as silicon oxide film, silicon nitride film or silicon oxinitride film (expressed by $SiO_xN_y$) which includes silicon and oxygen or nitrogen in a predetermined ratio.

Here, two TFTs are formed in a pixel 201 represents a TFT which serves as a switching element (hereinafter referred to as "switching circuit"), and 202 represents a TFT which controls the amount of a current flowing through an EL element (hereinafter referred to as "current control TFT"). They are both n-channel type TFTs.

The switching TFT 201 is formed with an active layer including a source region 13, a drain region 14, LDD regions 15a through 15d, a high density impurity region 16 and channel forming regions 17a and 17b, a gate insulation film 18, gate electrodes 19a and 19b, a first layer insulation film 20, a source line 21 and a drain line 22. As shown in FIG. 2A, the gate electrodes 19a and 19b are in a double gate structure in which they branch from the same gate line 211.

The active layer is constituted by a semiconductor film having a crystalline structure. That is, it may be a monocrystalline semiconductor film polycrystalline semiconductor film or microcrystalline semiconductor film. The gate insulation film 18 may be constituted by an insulation film including silicon. Any conductive film may be used for the gate electrodes, source line and drain line.

A storage capacitor 203 is connected to the switching TFT 201 (see FIG. 2B). The storage capacitor 203 is formed by a capacitor forming semiconductor region 23 electrically connected to the drain region 14, the gate insulation film 18 (which serves as a dielectric body for forming a capacitor where the storage capacitor 203 is formed) and a capacitor forming electrode 24. A connection line 25 is a line for applying a fixed potential (a ground potential in this case) which is formed simultaneously with the source line 21 and drain line 22 and which is connected to a current supply line 212.

At this time, the LDD regions 15a through 15d of the switching TFT 201 are provided such that they will not overlap the gate electrodes 19a and 19b with the gate insulation film 18 interposed.

The switching TFT 201 accumulates an electrical charge associated with a video signal (a signal including image information) in the storage capacitor when it is selected. Since the electrical charge must be continually maintained in an unselected state, the leakage of the electrical charge attributable to an off-current must be minimized. In this sense, the reduction of the off-current must be the top priority in designing the switching TFT 201.

In order to reduce the off-current, it is further preferable to provide an offset region (which is constituted by a semiconductor layer having the same composition as that of the channel forming region and to which the gate voltage is not applied) between the channel forming region and the LDD region. In the case of a multi-gate structure having two or more gate electrodes, the high density impurity region provided between the channel forming regions is effective in reducing the off-current. Although a multi-gate structure as in the present embodiment is desirable, a single gate structure may be employed.

The current control TFT 202 is formed with an active layer including a source region 31, a drain region 32, an LDD region 33 and a channel forming region 34, a gate electrode 35, a first layer insulation film 20, a source line 36 and a drain line 37. While the gate electrode 35 has a single gate structure, a multi-gate structure may be employed.

As shown in FIG. 2A, the gate electrode 35 is electrically connected to the drain region 14 of the switching TFT 201 through the drain line (which may be also referred to as "connection line") 22. The source line 36 is integral with the connection line 25 and is connected to the current supply line 212 similarly to the same.

The current control TFT 202 is characterized in that the LDD region 33 is provided between the drain region 32 and the channel forming region 34 and in that the LDD region 33 has an area which overlaps the gate electrode 35 with the gate insulation film 18 interposed and an area which does not overlap the same.

The current control TFT 202 supplies a current to cause the EL element 204 to emit light and enables gray scale display by controlling the amount of the same. It is therefore necessary to take a countermeasure to deterioration attributable to the injection of hot carriers in order to prevent deterioration even when a high current flows. The current control TFT 202 is kept in an off state to display black and, at this time, a high off-current disables clear display of black to reduce contrast. It is therefore also necessary to suppress the off-current.

Referring to deterioration attributable to the injection of hot carriers, structures in which the LDD region overlaps the gate electrode are known to be very effective in preventing the same. However, since the off-current is increased if the entire LDD region overlaps the gate electrode, the inventors have provided measures to deal with hot carriers and an off-current by employing a novel structure in which an LDD region having an area which does not overlap a gate electrode.

The length of the area of the LDD region that overlaps the gate electrode may be in the range from 1 to 3 μm (preferably from 0.3 to 1.5 μm). An increase in a parasitic capacitance occurs when this length is too large, and the effect of preventing hot carriers is reduced when it is too small. The length of the area of the LDD region that does not overlap the gate electrode may be in the range from 1.0 to 3.5 μm (preferably from 1.5 to 2.0 μm). A sufficient flow of current cannot be achieved this length is too larger and the effect of reducing the off-current is reduced when it is too small.

Since a parasitic capacitance is formed in the area of where the gate electrode and LDD region overlap in the above-described structure, it is preferable not to provide the same area between the source region 31 and channel forming region 34. Since carriers (electrons in this case) flows through the current control TFT always in the same direction, a sufficient effect can be achieved by providing the LDD region only on the side of the drain region.

As described above, two kinds of TFT having different structures are provided in a pixel depending on the function of the same. In the illustrated example, both of the switching TFT 201 and current control TFT 202 are n-channel type TFTs. This is very much advantageous in increasing an effective emitting area of an EL element because an n-channel type TFT can be formed smaller than a p-channel type TFT.

P-channel type TFTs are advantageous in that they are substantially free from the problem attributable to hot carrier injection and in that they have a low off-current, and reports have already been made on examples of the use of them as switching TFTs and current control TFTs. However, the present invention is further characterized in that a structure in which LDD regions are provided in different positions to solve the problem attributable to hot carrier injection and the problem of the off-current and in that all TFTs in all pixels can therefore be n-channel type TFTs.

41 represents a passivation film which is a silicon nitride film or a silicon oxinitride film 42 represents a color filter, and 43 represents a fluorescent body (also referred to as "fluorescent dye layer"). Both of them have the same combination of colors and include red (R), green (G) and blue (B) dyes. The color filter 42 is provided to improve color purity, and the fluorescent body 43 is provided to perform color conversion.

There are four general types of methods for color representation on EL displays, i.e., a method wherein three types of EL elements associated with R, G and B are formed, a method wherein EL elements emitting white light are combined with a color filter, a method wherein EL elements emitting blue light are combined with a fluorescent body (fluorescent color conversion layer: CCM) and a method wherein a transparent electrode is used as a cathode (counter electrode) and EL elements associated R, G and B are overlapped therewith.

The structure shown in FIG. 1 is an example of the method wherein EL elements emitting blue light are combined with a fluorescent body. A light emitting layer emitting blue light is used as the EL element 204 to generate light having a wavelength in the blue range including ultraviolet light, and the fluorescent body 43 is excited by the light to generate light in red, green or blue. The color purity of the light is improved by the color filter 42 which then outputs the light.

The present invention may be carried out regardless of the light emitting method used, and all of the above-described methods may therefore be used in the present invention.

After the color filter 42 and fluorescent body 43 are formed, planarization is carried out on the second layer insulation film 44. An organic resin film is preferably used as the second layer insulation film 44, and polyimide, acrylic resin or BCB (benzocyclobutene) may be used. Obviously, an inorganic film may be used if it can be sufficiently planarized.

45 represents a pixel electrode (anode of the EL element) which is constituted by a transparent conductive film and which is connected to the drain line 37 of the current control TFT by providing a contact hole in the second layer insulation film 44 and passivation film 41.

An EL layer (which is preferably made of an organic material) 46, a cathode 47 and a protective electrode 48 are sequentially formed on the pixel electrode 45. A multi-layer structure is often used for the EL layer 46, although it may have either of single-layer and multi-layer structures. While various multi-layer structures for EL layers have been proposed which are combinations of an electron transport layer and a hole transport layer in addition to a light emitting layer, the present invention accommodates any of such methods.

A material including magnesium (Mg), lithium or calcium (Ca) having a small work function is used for the cathode 47. A MgAg electrode is preferably used. The protective electrode 48 is an electrode provided to protecting the cathode 47 from ambient moisture which is formed using a material including aluminum (Al) or silver (Ag).

The EL layer 46 and cathode 47 are preferably continuously formed without exposing them to the atmosphere. That is, the EL layer and cathode are preferably continuously formed regardless of how they are stacked. The purpose is to prevent the EL layer from absorbing moisture as a result of exposure to the atmosphere when an organic material is used which is very much vulnerable to moisture. It is further preferable to continuously form not only the EL layer 46 and cathode 47 but also the protective electrode 48 thereon.

The EL display according to the invention has a pixel portion formed by pixels having a structure as described above, and TFTs having different structures are provided in each pixel depending on the function thereof. This makes it possible to form a switching TFT having a sufficiently low off-current and a current control TFT resistant to hot carrier injection in the same pixel, thereby allowing the formation of an EL display which has high reliability and which is capable of preferable display of images.

The present invention is not limited to a pixel portion of an EL display and can be equally applied to driving circuit portions of an active matrix EL display in which the driving circuit portions and a pixel portion are formed on the same substrate. Specifically, one principle of the invention is to provide TFTs having different structures in either of a circuit driving portion and a pixel portion depending on the functions required by the circuits or elements.

The present invention can be applied also to the formation of signal processing circuits in addition to driving circuit portions and pixel portions as described above. Such signal processing circuits include signal dividing circuits, D-A converters, γ-correction circuits, boosting circuits and differential amplifier circuits.

A more detailed description will be made on the present invention having the above-described configuration with reference to preferred embodiments.

Embodiment 1

A first embodiment of the invention will be described with reference to FIGS. 3A through 5C. A description will be made here on a method for fabricating TFTs of a pixel portion and driving circuit portions provided around the same simultaneously. For simplicity of the description, only a CMOS circuit is shown which is a basic circuit for such driving circuits.

First, as shown in FIG. 3A, an underlying film 301 having a thickness of 300 nm is formed on a glass substrate 300. In the present embodiment, the a silicon oxinitride film is used as the underlying film 301. At this time, the density of nitrogen in the region in contact with the glass substrate 300 is preferably in the range from 10 to 25 wt %.

Next, an amorphous silicon film (not shown) having a thickness of 50 nm is formed on the underlying film 301 using a known film forming method. The film is not limited to an amorphous silicon film, and it may be any semiconductor film (and any microcrystalline semiconductor film) including an amorphous structure. The film may alternatively be a compound semiconductor film including an amorphous structure such as an amorphous silicon germanium film. The thickness may be in the range from 20 to 100 nm.

The amorphous silicon film is then crystallized using known techniques to form a crystalline silicon film (also referred to "polycrystalline silicon film" or "polysilicon film") 302. Known methods for crystallization include thermal crystallization utilizing an electrically heated furnace, laser anneal crystallization utilizing laser light and lamp anneal crystallization utilizing infrared light. In the present embodiment, crystallization is performed using excimer laser light utilizing XeCl gas.

While pulse-oscillated excimer laser light formed in a linear configuration is used in the present embodiment, a rectangular configuration may alternatively be used. Continuously oscillated argon laser light or continuously oscillated excimer laser light may be used.

Then, as shown in FIG. 3B, a protective film 303 constituted by a silicon oxide film is formed to a thickness of 130 nm on the crystalline silicon film 302. A thickness within the range from 100 to 200 nm (preferably from 130 to 170 nm) may be chosen. Other types of insulation films may be used as long as silicon is included therein. The protective film 303 is provided to prevent direct exposure of the crystalline silicon film to plasma during doping with an impurity and to enable delicate density control.

Resist masks 304a through 304c are formed on the protective film to allow doping with an impurity element that provides n-type conductivity (hereinafter referred to as "n-type impurity element") through the protective film 303. As the n-type impurity element, an element belonging to the group V, typically, phosphorous or arsenic may be used. In the present embodiment, phosphorous is added in a density of $1\times10^{18}$ atoms/cm$^3$ using a plasma doping process in which phosphine (PH$_3$) is plasma-excited without performing mass separation on the same. It is obviously possible to use an ion implantation process which involves mass separation.

The dose is adjusted such that n-type impurity regions 305 through 307 formed at this step include the n-type impurity element in a density in the range from $2\times10^{16}$ to $5\times10^{19}$ atoms/cm$^3$ (typically, from $5\times10^{17}$ to $5\times10^{18}$ atoms/cm$^3$). The n-type impurity region 306 corresponds to the capacitor forming semiconductor region 23 shown in FIG. 1.

Next, as shown in FIG. 3C, the protective film 303 is removed to activate the added element belonging to the group V. While any known technique may be used as means for activation, activation is carried out by means of illumination with excimer laser light. Obviously, the invention is not limited to excimer laser light, and pulse-oscillated or continuously oscillated laser light may be used. Since the purpose is to activate the added impurity element, illumination is preferably carried out with an energy at which the crystalline silicon film is not melted. The illumination with laser light may be carried out with the protective film 303 unremoved.

When the impurity element is illuminated with laser light, activation may be simultaneously performed using furnace annealing or lamp annealing. Referring to activation using furnace annealing, a thermal process at a temperature in the range from 450 to 550° C. can be carried out taking the heat-resistance of the substrate into consideration. The activation may be carried out using only furnace annealing or lamp annealing.

As a result of this step, the edges of the n-type impurity regions 305 through 307, i.e., the boundaries (bonding portions) between the n-type impurity regions 305 through 307 and the regions around the same which are not doped with the n-type impurity element becomes clear. Therefore, very preferable bonding portions can be formed between the LDD regions and the channel forming region when the TFT is completed later.

Next, as shown in FIG. 3D, unnecessary portions of the crystalline silicon film are removed to form island-shaped semiconductor films (hereinafter referred to as "active layers") 308 through 311.

Next, as shown in FIG. 3E, a gate insulation film 312 is formed to cover the active layers 308 through 311. An insulation film including silicon with a thickness in the range from 10 to 200 nm (preferably in the range from 50 to 150 nm) may be used as the gate insulation film 312. This film may have either of single-layer or multi-layer structures. In the present embodiment, a 110 nm thick silicon oxinitride film is used, Next, a conductive film having a thickness in the range from 200 to 400 nm is formed and patterned to form gate electrodes 313 through 317 and a capacitor forming electrode 318. While a gate electrode and a gate line may be described as separate elements in this specification, the gate electrode may be regarded as being included in the gate line because the portion to serve as an electrode is called "gate electrode" only for convenience. This equally applies to the capacitor forming electrode, and the portion of the same which is not serving as an electrode may be referred to "capacitor forming line".

While the gate electrode may be constituted by single-layer conductive films, multi-layer films such as double-layer or triple-layer structures are preferably used as needed. Any known conductive film may be used as the material for the gate electrodes.

Specifically, it is possible to use thin films including tantalum (Ta), titanium (Ti), molybdenum (Mo), tungsten (W), chromium (Cr) or conductive silicon (Si) or thin films which are nitrides of the same (typically tantalum nitride films, tungsten nitride films or titanium nitride films) or alloy films which are combinations of the above elements (typically Mo—W alloys or Mo—Ta alloys) or silicide films including the above elements (typically tungsten silicide films or titanium silicide films). Such films may be used in either of single-layer and multi-layer structures.

In the present embodiment, multi-layer films formed by a 50 nm thick tantalum nitride (TaN) film and 350 nm thick Ta film are used. They may be formed using a sputtering process.

An inert gas such as Xe, Ne or the like may be used as the sputtering gas to prevent the films from coming off due to stress.

At this time, the gate electrodes 314 and 317 are formed such that they overlap a-part of the n-type impurity regions 305 and 307 respectively with the gate insulation film 312 interposed. Such overlaps become LDD regions which overlap the gate electrodes later. While the gate electrodes 315 and 316 look like two separate elements in the section, in practice, they are constituted by a single continuous pattern.

A capacitor forming electrode 318 is formed on the n-type impurity region 306 with the gate insulation film 312 interposed. At this time, the insulation film provided as the gate insulation film 312 is used here as a dielectric body for a storage capacitor to form a storage capacitor constituted by the n-type impurity region (capacitor forming semiconductor region) 306, gate insulation film 312 and capacitor forming electrode 318.

Next, as shown in FIG. 4A, an n-type impurity element (which is phosphorous in the present embodiment) is added in a self-aligning manner using the gate electrodes 313 through 317 and capacitor forming electrode 318 as masks. An adjustment is performed such that resultant impurity regions 319 through 325 are doped with phosphorous in a density in the range from ½ to ¹⁄₁₀ (typically from ⅓ to ¼) of that in the n-type impurity regions 305 through 307. Specifically, a density in the range from $1\times10^{16}$ to $5\times10^{18}$ atoms/cm$^3$ (typically from $3\times10^{17}$ to $3\times10^{18}$ atoms/cm$^3$ is preferable.

Next, as shown in FIG. 4B, resist masks 326a through 326c are formed to cover the gate electrodes and the like, and an n-type impurity element (which is phosphorous in the present embodiment) is added to form impurity regions 327 through 334 heavily doped with phosphorous. An ion doping process utilizing phosphine (PH$_3$) is performed again, and the density of phosphorous in those regions is adjusted such that it is within the range from $1\times10^{20}$ to $1\times10^{21}$ atoms/cm$^3$ (typically from $2\times10^{20}$ to $5\times10^{21}$ atoms/cm$^3$).

While this step forms the source regions or drain regions of the n-channel type TFTs, a part of the n-type impurity regions 322 through 324 formed at the step shown in FIG. 4A is left for the switching TFT. Such residual regions correspond to the LDD regions 15a through 15d of the switching TFT in FIG. 1.

Next, as shown in FIG. 4C, the resist masks 326a through 326c are removed to form a new resist mask 325. A p-type impurity element (which is boron in the present embodiment) is added to form impurity regions 336 and 337 heavily doped with boron. An ion doping process utilizing diborane ($B_2H_2$) is performed here to add boron in a density within the range from $3\times10^{20}$ to $3\times10^{21}$ atoms/cm$^3$ (typically from $5\times10^{20}$ to $1\times10^{21}$ atoms/cm$^3$).

While the impurity regions 319 and 320 have already been doped with phosphorous in a density within the range from $1\times10^{20}$ to $1\times10^{21}$ atoms/cm$^3$, boron is added here in a density which is at least three times the same density. As a result, the previously formed n-type impurity regions are completely inverted into the p-type to serve as p-type impurity regions.

Next, as shown in FIG. 4D, a first layer insulation film 338 is formed after removing the resist mask 325. The first layer insulation film 338 may be a single-layer insulation film including silicon or a multi-layer film which is a combination of insulation films including silicon. The thickness of the film may range from 400 nm to 1.5 μm. The present embodiment employs a structure in which a 800 nm thick silicon oxide film is formed on a 200 nm thick silicon oxinitride film.

Thereafter, the n-type or p-type impurity element added in the respective density is activated. The means for annealing may be furnace annealing, laser annealing or lamp annealing. In the present embodiment, a thermal process at 550° C. is performed for four hours in a nitrogen atmosphere in an electrically heated furnace.

Hydrogenation is further carried out by performing a thermal process at a temperature in the range from 300 to 450° C. for duration in the range from one to twelve hours in an atmosphere including 3 to 100% hydrogen. This is a step to terminate dangling bonds in the semiconductor film with thermally excited hydrogen. Plasma hydrogenation (which utilizes plasma-excited hydrogen) may be carried out as another means for hydrogenation.

The hydrogenation process may be included in the formation of the first layer insulation film 338. Specifically, the above-described hydrogenation process may be performed after the 200 nm thick silicon oxinitride film is formed, which is followed by the formation of the 800 nm thick silicon.

Figure 5A:
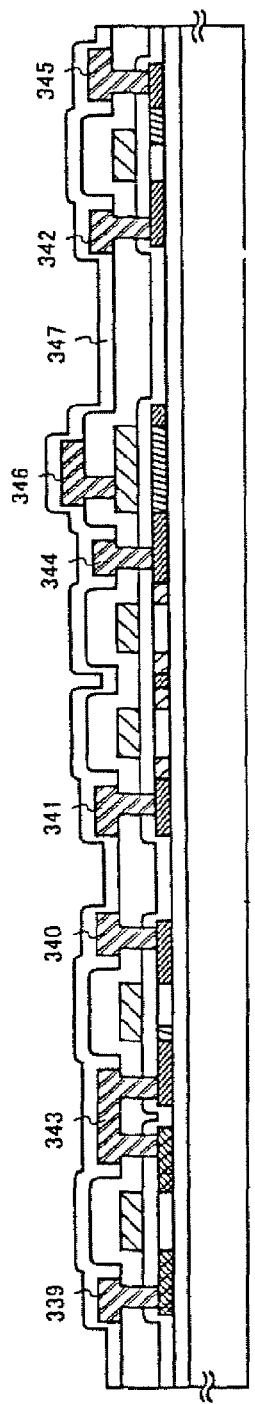
FIGS. 5A through 5C show steps for fabricating an active matrix EL display.

Next, as shown in FIG. 5A, contact holes are formed in the first layer insulation film 338 to form source lines 339 through 342, drain lines 343 through 345 and a connection line 346. In the present embodiment, these lines are in the form of a multi-layer film having a three-layer structure provided by continuously forming a 100 nm thick Ti film, a 300 nm thick aluminum film including Ti and 150 nm thick Ti film using a sputtering process.

Next, a passivation film 347 is formed to a thickness in the range from 50 to 500 nm (typically from 200 to 300 nm). In the present embodiment, a silicon oxinitride film having a thickness of 300 nm is used as the passivation film 347.

At this time, it is advantageous to perform a plasma process utilizing a gas including oxygen such as $H_2$ and $NH_3$ prior to the formation of the silicon oxinitride film. Hydrogen excited by this pre-process is supplied to the first layer insulation film 338, and a thermal process is performed to improve the quality of the passivation film 347. Simultaneously, the active layer can be effectively hydrogenated because the hydrogen added to the first layer insulation film 338 spreads toward underlying layers.

Figure 5B:
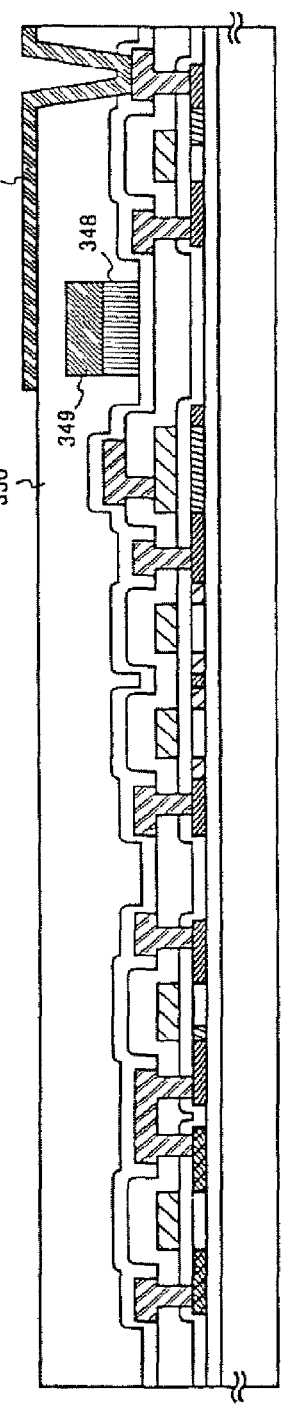

Next, as shown in FIG. 5B, a color filter 348 and a fluorescent body 349 are formed. Known materials may be used for them. They may be patterned separately or may alternatively continuously formed and patterned simultaneously. The thickness of each of them may be chosen within the range from 0.5 to 5 μm (typically from 1 to 2 μm). Especially, the optimum thickness of the fluorescent body varies depending on the material used. Specifically, a too small thickness will reduce color conversion efficiency, and a too large thickness will result in a large step and reduce the quantity of light transmitted thereby. Therefore, the optimum thickness must be determined as a tradeoff between those characteristics.

While the present embodiment has referred to the method for color display in which light emitted by the EL layer is subjected to color conversion, the color filter and fluorescent body may be omitted when a method is employed in which an EL layer is fabricated in association with each of R, G and B.

A second layer insulation film 350 made of organic resin is then formed. Polyimide, polyamide, acrylic resin or BCB (benzocyclobutene) may be used as the organic resin. Especially, acrylic resin having excellent planarity is preferred because the second layer insulation film is primarily intended for planarization. In the present embodiment, it is formed of acrylic resin with a thickness that allows any step between the color filter 348 and fluorescent body 349 to be planarized.

Next, a contact hole is formed in the second layer insulation film 350 and passivation film 347 down to the drain line 345 to form a pixel electrode 351. In the present embodiment, a conductive film made of a compound of indium oxide and tin oxide (ITO film) is formed to a thickness of 110 nm and is patterned into a pixel electrode. This pixel electrode serves as the anode of an EL element.

Figure 5C:
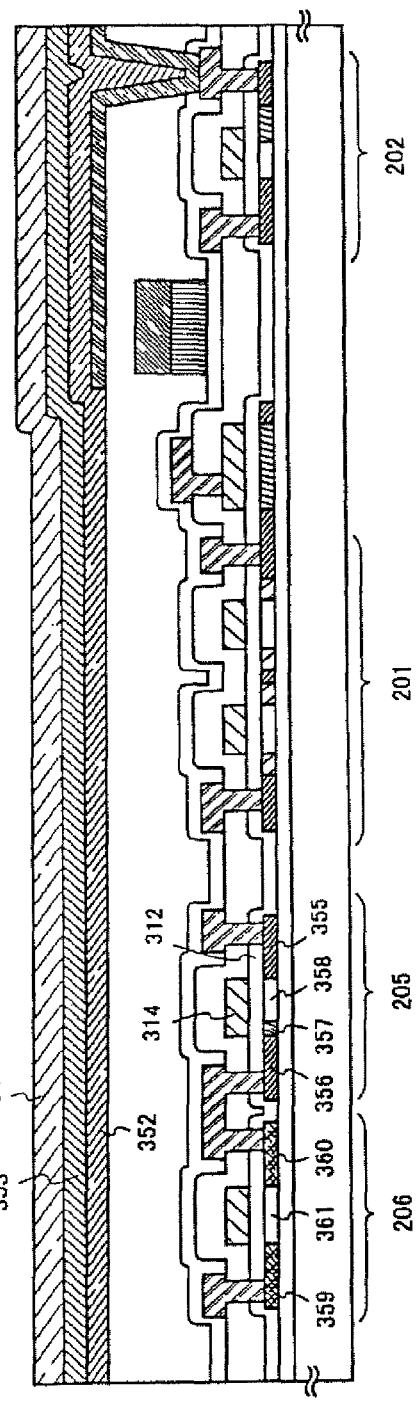

Next, as shown in FIG. 5C, an EL layer 352, a cathode (MgAg electrode) 353 and a protective electrode 354 are continuously formed without exposing them to the atmosphere. Any known material may be used for the EL layer 352. Known materials include organic materials, and it is preferable to use an organic material when the driving voltage is taken into consideration. In the present embodiment, the EL layer is constituted by a four-layer structure formed by a hole injection layer, a hole transport layer, an emission layer and an electron injection layer. While an MgAg electrode is used as the cathode of an EL element in the present embodiment, any other known material may be used.

The protective film 354 is provided to prevent deterioration of the MgAg electrode 353 and is preferably constituted by an aluminum film (a conductive film including aluminum). Any other material may obviously be used. Since the EL layer 352 and MgAg electrode 353 are vulnerable to moisture, continuous formation is preferably extended to the protective electrode 354 without exposing them to the atmosphere in order to protect the EL layer from the atmosphere.

The thickness of the EL layer 352 may be in the range from 800 to 200 nm (typically from 100 to 120 nm), and the thickness of the MgAg electrode may be in the range from 180 to 300 nm (typically from 200 to 250 nm).

This completes an active matrix EL display having a structure as shown in FIG. 5C. In practice, it is further preferable to package the display with a highly hermetic protective film (a laminate film or the like) to prevent it from being exposed to the atmosphere. In doing so, the reliability of the EL layer is improved by introducing an inert atmosphere into the protective film.

After performing the packaging process to improve hermetic properties, a connector (flexible printed circuit: FPC) for connecting a terminal coming from the elements or circuits formed on the substrate and an external signal terminal is attached to compete the display as a product. An EL display in such a state is referred to as "EL module" in the present specification.

The active matrix EL display of the present embodiment has very high reliability and can exhibit improved operating characteristics because TFTs with optimum structures are provided in the driving circuit portions and the pixel portion.

A TFT having a structure to reduce hot carrier injection is used as an n-channel type TFT 205 of a CMOS circuit forming a part of a driving circuit. Driving circuits in this context include shift registers, buffers, level shifters, sampling circuits (sample-and-hold circuits) and the like. D-A converters or latches are further included when digital driving is performed.

In the present embodiment, as shown in FIG. 5C, the active layer of the n-channel type TFT 205 includes a source region 355, a drain region 356, an LDD region 357 and a channel forming region 358, and the LDD region 357 overlaps the gate electrode 314 with the gate insulation film 312 interposed.

The LDD region is formed only on the side of the drain region in order to avoid any reduction of the operating speed. In the case of the n-channel type TFT 205, the operating speed is of greater importance and the off-current is a not so serious concern. Therefore, the LDD region 357 is preferably overlapped with the gate electrode completely to minimize resistive components. That is, the so-called offset is preferably eliminated.

There is no particular need for providing an LDD region in the p-channel type TFT 206 in the CMOS circuit for which there is substantially no concern about deterioration attributable to hot carrier injection. The active layer therefore includes a source region 359, a drain region 360 and a channel forming region 361. Obviously, an LDD region may be provided just as in the n-channel type TFT 205 to cope with hot carriers.

A sampling circuit is somewhat different from other driving circuits in that there is a bidirectional flow of a high current through the channel forming region. That is, the functions of the source and drain regions are switched. Further, there is a need for minimizing the off-current and, for this reason, it is therefore preferable to provide it with a TFT having function that is intermediate between those of switching and current control TFTs.

Figure 8:
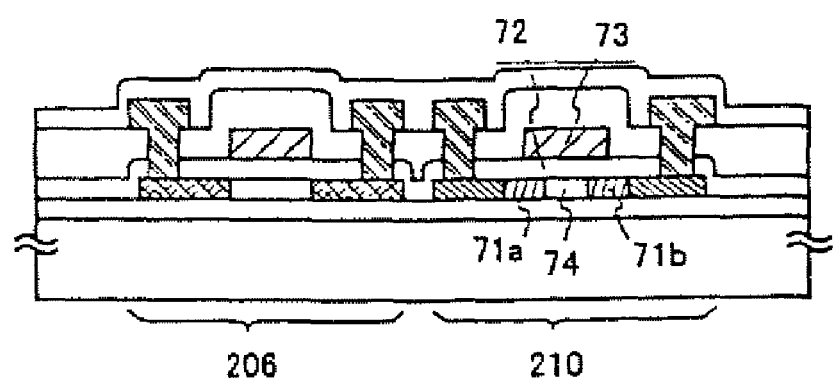
FIG. 8 shows a configuration of elements in a sampling circuit of an EL display.

Therefore, an n-channel type TFT to form a sampling circuit preferably has a structure as shown in FIG. 8. As shown in FIG. 8, a part of LDD regions 71a and 71b overlap a gate electrode 73 with a gate insulation film 72 interposed. This results in the effect as described above with reference to the current control TFT 202, and the structure for a sampling circuit is different only in that a channel forming region 74 is sandwiched.

Pixels having a structure as shown in FIG. 1 are provided to form a pixel portion. The structures of switching and current control TFTs formed in a pixel will not be described here because they have already been described with reference to FIG. 1.

Embodiment 2

The present embodiment will refer to a case in which a pixel portion of an active matrix EL display has a structure different from that shown in FIG. 1.

FIG. 6A shows an example of a structure of a switching TV different from that shown in FIG. 1. A current control TFT 202, storage capacitor 203 and EL element 204 shown in FIG. 6A will not be described because they have completely the same structures as those in the first embodiment. The switching TFT is given new reference numbers only in parts where it is necessary, and the description for FIG. 1 will be used as it is for the remaining parts.

The switching TFT 201 shown in FIG. 1 and the switching TFT 207 shown in FIG. 6A are different in the positions where the LDD regions are formed. While the LDD regions 15a through 15d in FIG. 1 are formed such that they do not overlap the gate electrodes 19a and 19b, the LDD regions of the present embodiment are formed such that they partially overlap gate electrodes.

Specifically, as shown in FIG. 6A, a part of LDD regions 50a through 50d of the switching TFT 207 overlaps gate electrodes 51a and 51b with a gate insulation film interposed. In other words, the LDD regions 50a through 50d have areas which overlap the gate electrodes 51a and 51b with a gate insulation film interposed.

This makes it possible to minimize the off-current and to prevent deterioration attributable to hot carrier injection. Since a parasitic capacitance is generated between the gate electrodes and LDD regions, the operating speed may be somewhat lower than that of the structure in FIG. 1. However, a switching TFT with high reliability can be formed if attention is paid during designing.

FIG. 6B shows an example of a structure of a current control TFT different from that shown in FIG. 1. A switching TFT 201, storage capacitor 203 and EL element 204 shown in FIG. 6B will not be described because they have completely the same structures as those in the first embodiment. The current control TFT is given new reference numbers only in parts where it is necessary, and the description for FIG. 1 will be used as it is for the remaining parts.

The current control TFT 202 shown in FIG. 1 and the current control TFT 208 shown in FIG. 6B are different in the position where the LDD region is formed. While the LDD regions 33 in FIG. 1 is formed such that it partially overlaps the gate electrode 35, the LDD region of the present embodiment is formed such that it partially overlaps a gate electrode.

Specifically, as shown in FIG. 6B, an LDD region 52 of the current control TFT 208 completely overlaps a gate electrode 53 with a gate insulation film interposed. In other words, the LDD region 52 does not have any area which does not overlap the gate electrode 53.

When the lowest voltage of a video (image) signal is applied to the gate of the current control TFT, the EL element emits light if the off-current is not sufficiently low, which results in a reduction of contrast. In the structure in FIG. 1, an LDD region which does not overlap the gate electrode is provided in order to reduce the off-current at that time.

However, since the LDD region which does not overlap the gate electrode acts as a resistive component, some reduction of the operating speed and on-current occurs. Therefore, the structure of the present embodiment wherein such a region is not provided makes it possible to eliminate such a resistive component, which allows a higher current to flow. In this case, however, a TFT must be used which exhibits a sufficiently low off-current when the lowest voltage of a video (image) signal is applied to the gate of the current control TFT.

The switching TFT 207 in FIG. 6A and the current control TFT in FIG. 6B may be used in combination. The first embodiment 1 may be referred to for steps for fabricating them.

Embodiment 3

Figure 7:
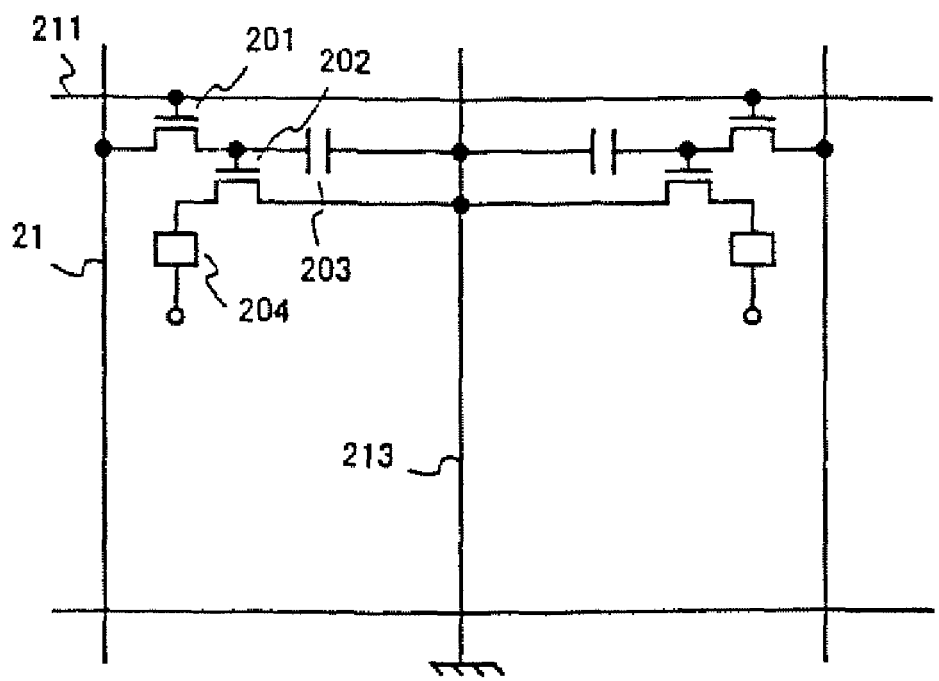
FIG. 7 shows a configuration of elements in a pixel portion of an EL display.

FIG. 7 shows an example of a pixel configuration according to the present embodiment which is different from that shown in FIG. 2B.

In the present embodiment, two pixels as shown in FIG. 2B are provided such that they are symmetric about a current source line 212 for supplying a ground potential. Specifically, as shown in FIG. 7, the current supply line 212 is shard by the two pixels adjacent thereto, which reduces the number of lines required. The structures of the TFTs provided in the pixel and the like may be kept unchanged.

Such a configuration makes it possible to fabricate a pixel portion having higher definition, thereby improving image quality. The configuration according to the present embodiment can be easily implemented according to the fabrication steps of the first embodiment, and the TFT structure may be combined with those in the second embodiment.

Embodiment 4

Figure 9:
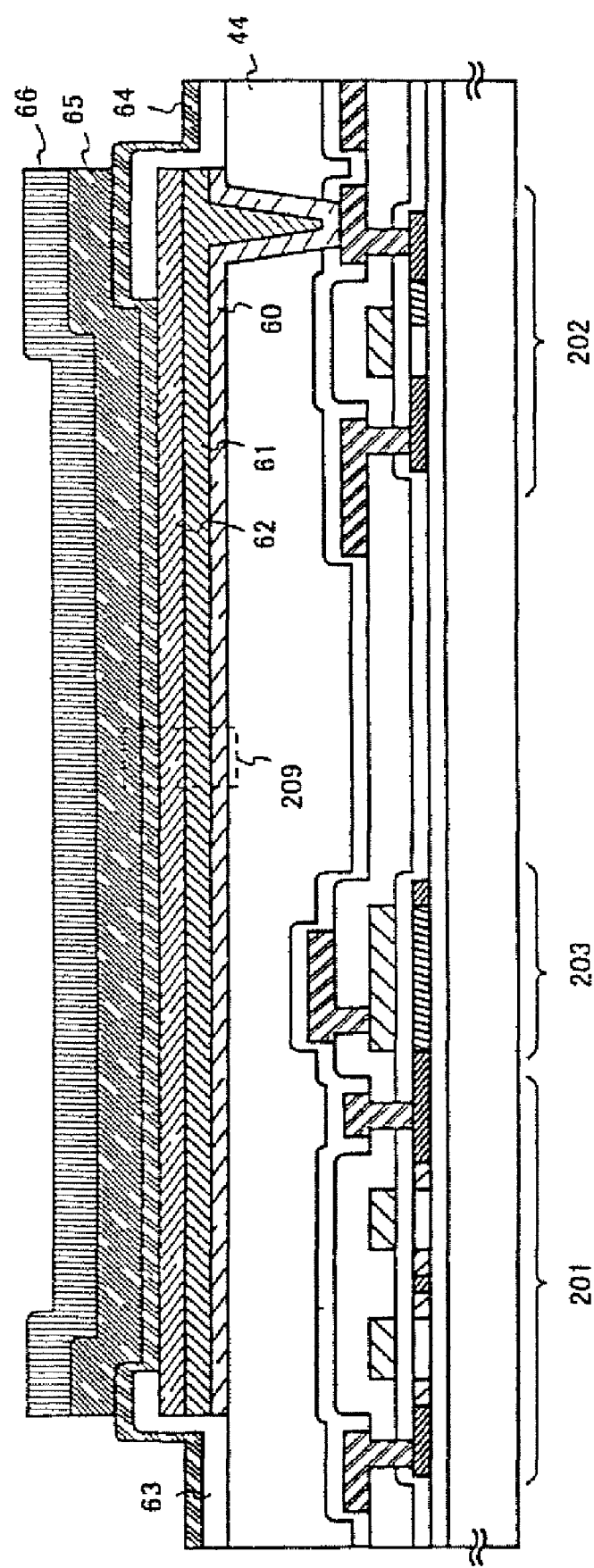
FIG. 9 shows a sectional structure of a pixel portion of an EL display.

FIG. 9 shows an example of the formation of a pixel portion having a structure different from that in FIG. 1 according to the present embodiment. Steps up to the formation of a second layer insulation film 44 are in accordance with the first embodiment. A switching TFT 201, a current control TFT 202 and a storage capacitor 203 covered by the second layer insulation film 44 will not be described because they have the same structures as those in FIG. 1.

In the present embodiment, a pixel electrode 60, a cathode 61 and an EL layer 62 are formed after forming a contact hole in the second layer insulation film 44. They may be provided by continuously forming respective materials without exposing them to the atmosphere and by patterning them through simultaneous etching.

In the present embodiment, a 150 nm thick aluminum alloy film (an aluminum film including 1 wt % titanium) is provided as the pixel electrode 60. While any material may be used as the material for the pixel electrode as long as it is a metal material, a material having high reflectivity is preferred.

A 230 nm thick MgAg electrode is used as the cathode 61, and the EL layer 62 has a thickness of 120 nm. The material described in the first embodiment may be used to form the EL layer 62.

An insulation film including silicon is then formed to a thickness in the range from 200 to 500 nm (typically from 250 to 300 nm) and is patterned to form a protective film 63 having an opening. An anode 64 constituted by a transparent conductive film (which is an ITO film in the present embodiment) is formed thereon to a thickness of 110 nm. Alternatively, the transparent conductive film may be made of a compound of indium oxide and zinc oxide, tin oxide, indium oxide or zinc oxide. They may be also used with gallium added thereto.

Further, a fluorescent body 65 and a color filter 66 are formed on the anode 64 to complete a pixel portion as shown in FIG. 9.

Red, green or blue light generated by the structure according to the present embodiment is emitted oppositely to the substrate on which the TFTs are formed. It is therefore possible to use the substantially entire area of a pixel including the area where the TFTs are formed as a light emitting region. This significantly increases the effective light-emitting area of the pixel and improves the brightness and contrast of images.

The configuration according to the present embodiment may be used in an arbitrary combination with either of the configurations according to the second and third embodiments.

Embodiment 5

While the first embodiment utilizes laser crystallization as means for forming the crystalline silicon film 302, the present embodiment refers to a case wherein different means for crystallization is used.

In the present embodiment, after an amorphous silicon film is formed, it is crystallized using the technique disclosed in Japanese Laid-Open patent publication No. 7-130652. The same publication discloses a technique in which nickel is used as a catalytic element for promoting crystallization to provide a crystalline silicon film having high crystallinity.

A step of removing the catalytic element used for crystallization may be performed when the crystallization step is terminated. In this case, the technique disclosed in Japanese Laid-Open patent publication No. 10-270363 or 8-330602 may be used to getter the catalytic element.

The TFTs may be formed using the technique disclosed in the specification of Japanese patent application No. 11-076967 made by the applicant. The specification of Japanese patent application No. 11-076967 may be referred to up to the formation of TFTs, although it describe a storage capacitor different from that in FIG. 1.

The principle of the invention is to provide TFTs having appropriate structures depending on the functional requirements of elements as described in the first embodiment with reference to FIG. 1, but the invention is not limited to the described method for fabrication. Specifically, the fabrication steps described in the first embodiment are merely an example, and other fabrication steps may be used without any problem as long as they can provide the structure in FIG. 1 or FIG. 5C according to the first embodiment.

When the structure in FIG. 1 or FIG. 5C is combined with the structure according to any of the second through fourth embodiments, the fabrication steps described in the present embodiment may be combined with the fabrication of such a structure.

Embodiment 6

A step of etching the gate insulation film 312 may be added between the steps shown in FIGS. 4A and 4B according to the first embodiment. Specifically, the gate insulation film 312 is etched in a self-aligning manner using the gate electrodes 313 through 317 and the capacitor forming electrode 318 as masks after an n-type impurity element is added as shown in FIG. 4A. This etching is continued until the active layer is exposed.

In the present embodiment, dry etching is performed using $CHF_3$ gas as the etching gas because the gate insulation film used in the first embodiment is a silicon oxinitride film. Obviously, there is no limitation on other etching conditions.

A step of doping the exposed active layer with an n-type impurity element is then performed as shown in FIG. 4B. The process at this step can be performed in a very short time because phosphorous is directly added to the active layer without intervention of the gate insulation film. Further, since the low acceleration speed during doping can be low, damage to the active layer can be reduced.

Thereafter, the steps in the first embodiment may be followed to complete an EL display. The configuration according to the present embodiment may be implemented in an arbitrary combination with the combination according to any of the first through fifth embodiments.

Embodiment 7

The present embodiment will refer to an active matrix EL display in which pixels having a structure different from that in the first embodiment are formed.

FIG. 10A shows the EL display according to the present embodiment in which the TFTs structures are the same as those in the first embodiment (see FIG. 5C). According to the present embodiment, a pixel electrode 1001, a cathode 1002, an EL layer 1003 and an anode 1004 are formed, and an EL element 1000 is formed by the cathode 1002, EL layer 1003 and anode 1004. At this time, any known conductive film may be used as the pixel electrode 1001. In the present embodiment, an MgAg film is used as the cathode 1002, and a transparent conductive film obtained by adding gallium oxide to zinc oxide is used as the anode 1004. The EL layer 1003 may be formed by combining known materials.

The present embodiment is characterized in that a recess formed in a contact portion of the pixel electrode 1001 (a portion where the pixel electrode 1001 and the current control TFT 202 are connected) is filled with an insulator 1005 and in that edges of the pixel electrode 1001 are covered with an insulator 1006.

The insulator 1005 prevents any defect of the coating of the EL layer attributable to a step by filing the recess. When a contact hole formed in the second layer insulation film 350 is deep (which results in a large step), defects can occur in the coating of the EL layer to cause shorting between the cathode 1002 and anode 1004. The present embodiment is characterized in that the recess is filled with the insulator 1005 to prevent any defects in the coating of the EL layer.

Further, since a step is similarly formed at the edges of the pixel electrode 1001 in a size corresponding to the thickness of the pixel electrode 1001, the insulator 1006 is formed for the same reason as for the insulator 1005. This makes it possible to reliably prevent shorting between the cathode 1002 and anode 1004 at the edges of the pixel electrode 1001. Another purpose of the insulator 1006 is to prevent concentration of electrical fields in the EL layer 1003 because concentration of electrical fields is likely to occur at the edges of the pixel electrode 1001 to promote deterioration of the EL layer 1003.

FIG. 10B shows an example of a structure in which no LDD region is formed in the active layer of a current control TFT. Such a structure is possible because there is substantially no concern about deterioration attributable to hot carrier injection when the voltage applied to the EL element falls to 10 V or less or, more preferably, to 5V or less. In the structure shown in FIG. 10B, the active layer of the current control TFT is formed by a source region 1010, a drain region 1011 and a channel forming region 1012.

The configuration according to the present embodiment may be used in an arbitrary combination with the configuration according to any of the first through sixth embodiments.

Embodiment 8

The driving of an EL display according to the invention can be carried out on an analog basis using an analog signal as an image signal or on a digital basis using a digital signal.

In the case of analog driving, an analog signal is transmitted to the source line of the switching TFT, and the analog signal including gray scale information constitutes the gate voltage of the current control TFT. The current control TFT controls the current that flows through the EL element to control the intensity of the emission of the EL element, thereby allowing gray scale display.

In the case of digital driving, gray scale display referred to as "time-division driving" is performed unlike the gray scale display on an analog basis. Specifically, the emitting time is adjusted to provide visual appearance that seems like changes in color gradation.

An EL element can be driven at a high speed because it has a response speed which is much higher than that of a liquid crystal element. Therefore, it can be regarded as an element suitable for time-division driving in which a single frame is divided into a plurality of subframes to allow gray scale display.

Any driving method may be used because the present invention is a technique relating to element structures as described above.

Embodiment 9

While an organic EL material is preferably used for the EL layer in the first embodiment, the present invention may be implemented using an inorganic EL material. However, since driving voltages for currently available inorganic EL materials are very high, TFTs having voltage withstand characteristics that accommodate such driving voltages must be used in the case of analog driving.

It will be possible to apply the present invention to inorganic EL materials driven at lower voltages which will possibly be developed in the future.

The configuration according to the present embodiment may be freely combined with the configuration according to any of the first through seventh embodiments.

Embodiment 10

The external view of an EL display device of the present invention is described. Note that FIG. 11A is a top view of the EL display device of the present invention, and FIG. 11B is a cross sectional view thereof.

Figure 11A:
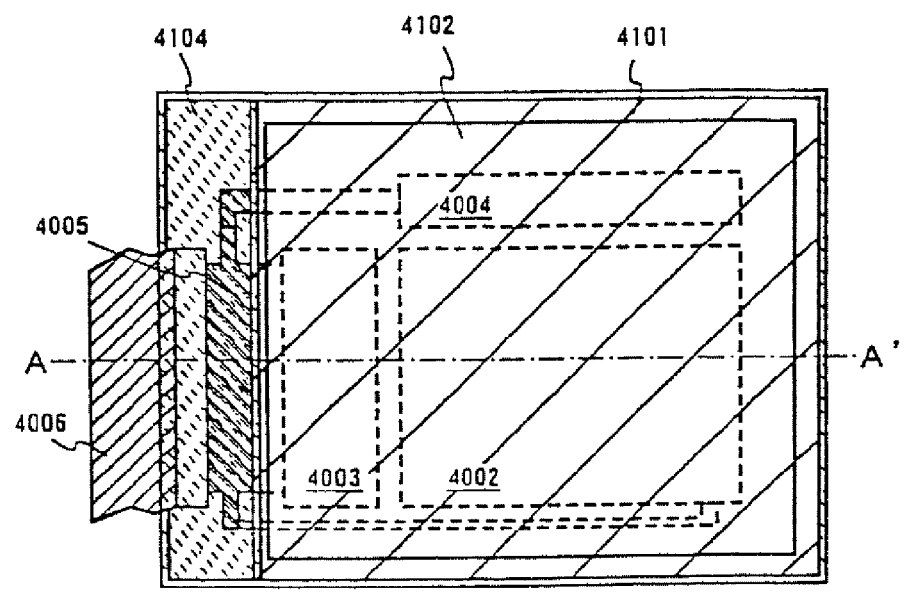
FIGS. 11A and 11B show a top surface structure and a sectional structure of an EL display.

In FIG. 11A, reference numeral 4001 is a substrate, 4002 is a pixel section, 4003 is a source side driver circuit, and 4004 is a gate side driver circuit; each driver circuit reaches to a FPC 4006 through wiring 4005, and then connected to the external machines.

A first sealing material 4101, a cover material 4102, fillings 4103 and a second sealing material 4104 are disposed here so as to cover the pixel section 4002, source side driver circuit 4003 and gate side driver circuit 4004.

Figure 11B:
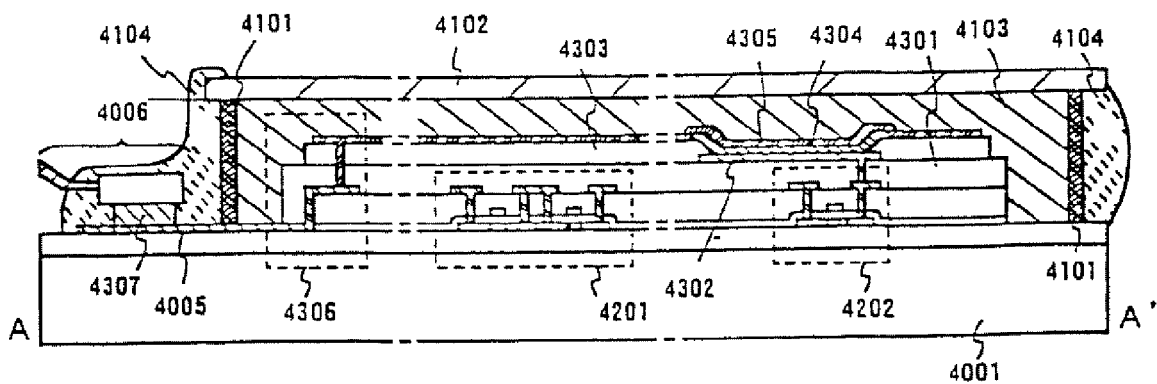

FIG. 11B corresponds to a cross section at line A-A' of FIG. 11A, and a driver circuit 4201 (note that an n-channel TFT and a p-channel TFT is formed here) which comprises the source side driver circuit 4003 and a current controlling TFT 4202 which comprises the pixel section 4002 are formed over a substrate 4001.

A TFT having the same structure as the n-channel TFT 205 and the p-channel TFT 206 of FIG. 5C is used for the driver TFT 4201, and a TFT having the same structure as the n-channel TFT 202 of FIG. 1 is used for the current controlling TFT 4202 in the present embodiment. Further, a storage capacitor (not shown in the Figure) connected to the gate of the current controlling TFT 4202 is provided in the pixel section 4002.

An interlayer insulating film (flattening film) 4301 comprising a resin material is formed over the driver TFT 4201 and the pixel TFT 4202, and a pixel electrode (cathode) 4302 is formed thereon which electrically connects to the drain of pixel TFT 4202. A conductive film having a small work function is used for the pixel electrode 4302. A conductive film comprising an element that belongs to group 1 or 2 of periodic table (typically a conductive film of aluminum, copper or silver that includes alkali metal element or alkaline earth metal) can be used.

An insulating film 4303 is formed over the pixel electrode 4302, and an opening section is formed in the insulating film 4303 on the pixel electrode 4302. An EL (electro-luminescence) layer 4304 is formed over the pixel electrode 4302 at this opening section. A publicly known organic EL material or inorganic EL material can be used for the EL layer 4304.

Further, though there are small molecular type (monomer type) material and polymer material among the organic EL materials, either may be used.

A technique of public domain such as evaporation technique or coating technique may be utilized for the manufacturing method of the EL layer 4304. The structure of the EL layer may be a laminate structure or a single layer structure, in which hole injection layer, hole transport layer, light emitting layer, electron transport layer or electron injection layer are freely combined.

An anode 4305 comprising a transparent conductive film is formed over the EL layer 4304. A compound of indium oxide and tin oxide, a compound of indium oxide and zinc oxide, indium oxide, tin oxide, zinc oxide or a compound added with gallium in these compounds, can be used for the transparent conductive film.

It is preferable to remove as much as possible of the moisture and oxygen existing in the interface between the anode 4305 and the EL layer 4304. It is therefore necessary to take measures such as depositing the two continuously inside a vacuum, or forming the EL layer 4304 in nitrogen or noble gas atmosphere and then forming the anode 4305 without exposure to oxygen and the moisture. It is possible to perform the above film deposition in the present embodiment by using a multi-chamber system (cluster tool system) deposition apparatus.

The anode 4305 is then electrically connected to the wiring 4005 in a region denoted as 4306. The wiring 4005 is a wiring for applying a preset voltage to the anode 4305, and electrically connected to FPC 4006 through an anisotropic conductive film 4307.

An EL element comprising pixel electrode (cathode) 4302, EL layer 4303 and anode 4305 is thus formed. This EL element is covered by a first sealing material 4101 and covering material 4102 which is stuck to the substrate 4001 by the first sealing material 4101, and sealed by fillings 4103.

A glass material or a plastic material (including plastic film) can be used for the covering material 4102. FRP (fiber-glass-reinforced plastics) plate, PVF (poly vinyl fluoride) film, Myler film, polyester film or acrylic resin film can be used for the plastic material.

A ultraviolet-ray curing resin or a thermosetting resin can be used for the fillings 4103, and PVD (poly vinyl chloride), acrylic, polyimide, epoxy resin, silicone resin, PVB (polyvinyl butyral) or EVA (ethylene vinyl acetate) can be used. The degradation of EL elements can be prevented when a drying agent (preferably barium oxide) is provided on the inside of the fillings 4103.

Further, spacers may be contained in the fillings 4103. In this case it is possible to give moisture absorption property to the spacer itself when the spacers are formed from barium oxide. Further when spacers are disposed it is effective to provide a resin film over the anode 4305 as a buffer layer which relieves the pressure from the spacers.

Further, wiring 4005 is electrically connected to the FPC 4006 by interposing anisotropic conductive film 4307. The wiring 4005 transmits to FPC 4006, signal sent to pixel section 4002, source side driver circuit 4003 and gate side driver circuit 4004, and is electrically connected to an external machine through the FPC 4006.

In the present embodiment a second sealing material 4104 is disposed to cover the exposed portion of the first sealing material 4101 and a part of FPC 4006 which is a structure to thoroughly shut the EL elements from the external atmosphere. In this way an EL display device having the cross sectional structure of FIG. 11B is formed. Note that it is acceptable to fabricate the EL display device of the present embodiment by combining any constitution of the Embodiments 1 to 9.

Embodiment 11

Figure 12A:
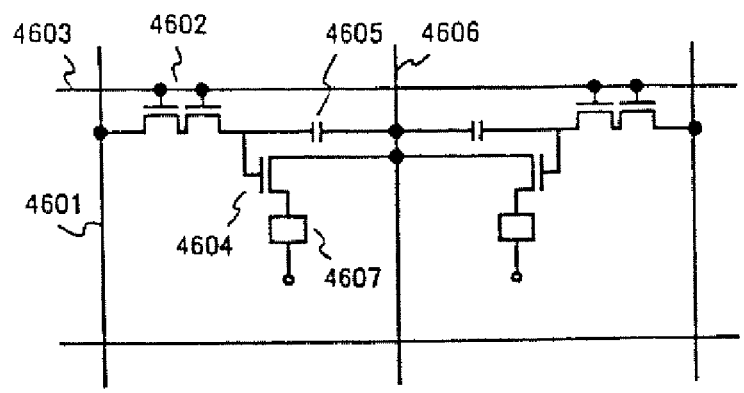
FIGS. 12A through 12C show circuit configurations of a pixel portion of an EL display.
Figure 12B:
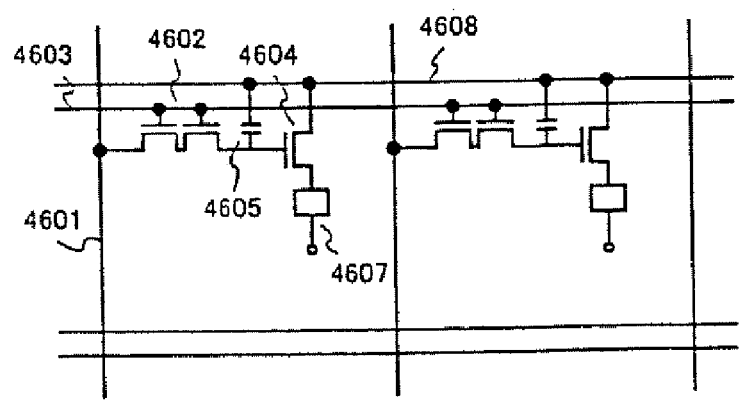
Figure 12C:
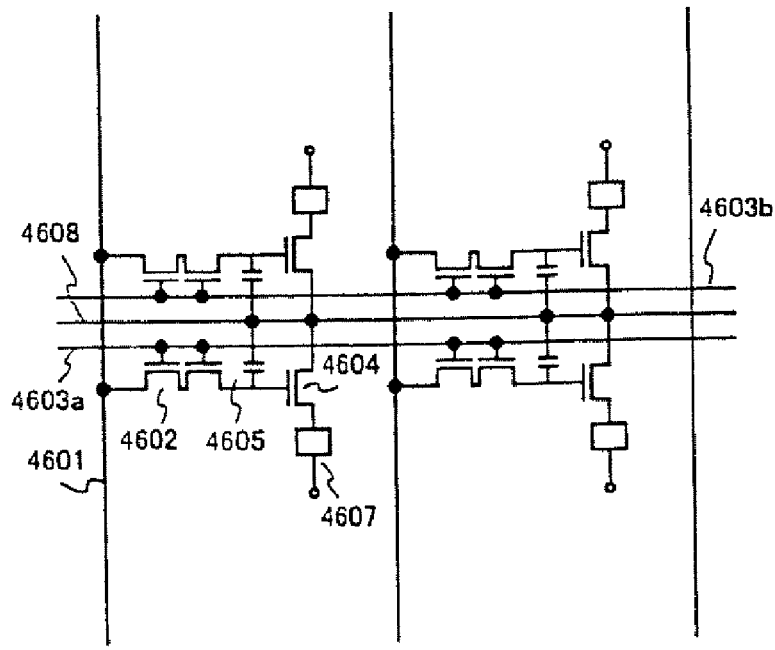

The present embodiment shows in FIGS. 12A to 12C an example of pixel structure of the EL display device of the present invention. Note that in this embodiment, reference numeral 4601 denotes a source wiring of a switching TFT 4602; 4603, gate wirings of the switching TFT 4602; 4604, a current controlling TFT; 4605, a capacitor; 4606 and 4608, electric current supply line; and 4607, an EL element.

FIG. 12A shows an example in which the current supply line 4606 is shared by two pixels. In other words, this example is characterized in that two pixels are formed so as to be axisymmetric with respect to the current supply line 4606. In this case, the number of current supply lines can be reduced, further enhancing the definition of the pixel section.

FIG. 12B shows an example in which the current supply line 4608 is arranged in parallel with the gate wirings 4603. Though the current supply line 4608 is arranged so as not to overlap with the gate wirings 4603 in FIG. 12B, the two can overlap with each other through an insulating film if the lines are formed in different layers. In this case, the current supply line 4608 and the gate wirings 4603 can share their occupying area, further enhancing the definition of the pixel section.

FIG. 12C is characterized in that the current supply line 4608 is arranged, similar to the structure in FIG. 12B, in parallel with the gate wirings 4603 and, further, two pixels are formed to be axisymmetric with respect to the current supply line 4608. It is also effective to arrange the current supply line 4608 so as to overlap with one of the gate wirings 4603. In this case, the number of current supply lines can be reduced, further enhancing the definition of the pixel section.

Note that it is possible to freely combine the constitution of the present embodiment with any of the constitution of the Embodiments 1 to 10.

Embodiment 13

Figure 13A:
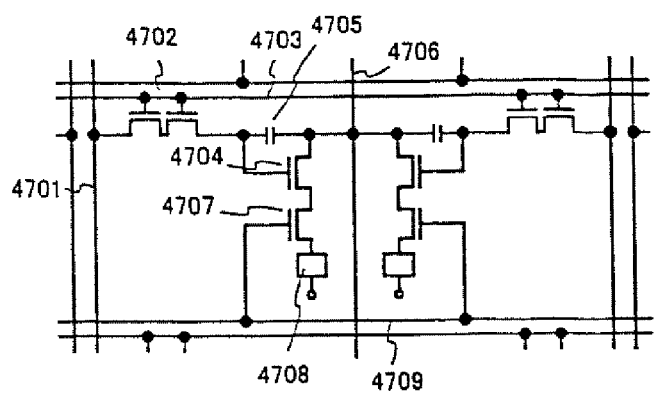
FIGS. 13A and 13B show circuit configurations of a pixel portion of an EL display.
Figure 13B:
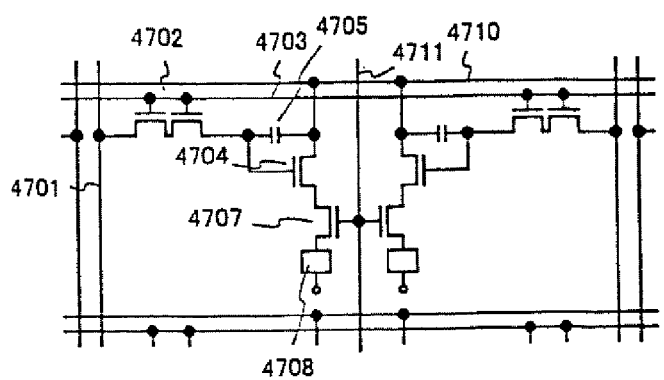

In the present embodiment examples of pixel structures of EL display devices are shown in FIGS. 13A and 13B. Note that in the present embodiment reference numeral 4701 is a source wiring of switching TFT 4702, 4703, gate wiring of switching TFT 4702; 4704, current control TFT; 4705, capacitor (can be omitted); 4706, current supply line; 4707, power source control TFT; 4708, gate wiring for power source control; and 4709, EL element. Japanese Patent Application No. 11-341272 may be referred as to operation of power source control TFT 4707.

Further, though the present embodiment provides the power source control TFT 4707 between current control TFT 4704 and EL element 4708, it may be a structure in which current control TFT 4704 is provided between power source control TFT 4707 and EL element 4708. Moreover, it is preferable to form the power source control TFT 4707 in the same structure as the current control TFT 4704, or formed connected in series by the same active layer.

FIG. 13A is an example of a case in which current supply line 4706 is shared between 2 pixels. Namely it is characterized in that 2 pixels are formed axisymmetric around the current supply line 4706. In this case, because the number of current supply lines can be reduced, pixel section can be further made into high definition.

FIG. 13B is an example of a case in which current supply line 4710 is provided in parallel with the gate wiring 4703 and power supply control gate wiring 4711 is provided in parallel with the source wiring 4701. Though the current supply line 4710 and gate wiring 4703 are provided so as not to overlap in FIG. 13B, these can be provided to overlap by interposing an insulating film if these are wirings formed in different layers. In this case, the area used exclusively by the current supply line 4710 and the gate wiring 4703 can be shared, so the pixel section can be made even higher definition.

Note that it is possible to freely combine the constitutions of the present embodiment with any constitution of Embodiments 1 to 10.

Embodiment 14

Figure 14A:
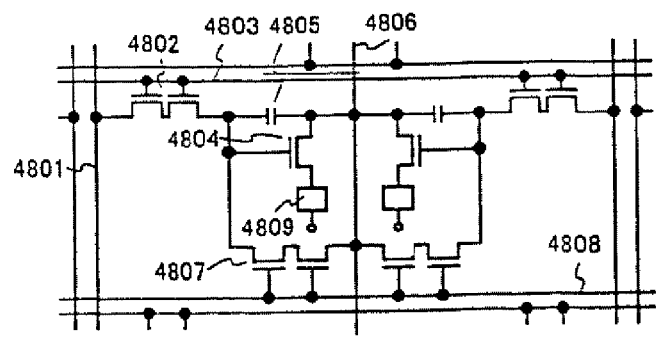
FIGS. 14A and 14B show circuit configurations of a pixel portion of an EL display.
Figure 14B:
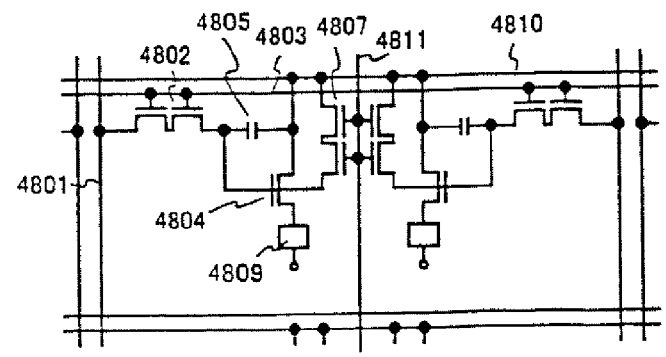

This embodiment gives a description with reference to FIGS. 14A and 14B on an example of the pixel structure for the EL display device of the present invention. In this embodiment, reference numeral 4801 denotes a source wiring of a switching TFT 4802; 4803, a gate wiring of the switching TFT 4802; 4804, a current controlling TFT; 4805, a capacitor (can be omitted); 4806, a current supply line; 4807, an erasing TFT; 4808, an erasing gate electrode; and 4809, an EL element. Japanese Patent Application No. 11-338786 may be referred for the operation of the erasing TFT 4807.

A drain of the erasing TFT 4807 is connected to a gate of the current controlling TFT 4804 so that the gate voltage of the current controlling TFT 4804 can forcibly be changed. The erasing TFT 4807 may be either of N channel type or of P channel type, but preferably has the same structure as the switching TFT 4802 to reduce the OFF current.

FIG. 14A shows an example in which two pixels share the current supply line 4806. That is, the example is characterized in that two pixels are formed such that they are axisymmetric with respect to the current supply line 4806. In this case, the number of current supply lines can be reduced to obtain even higher definition for the pixel portion.

FIG. 14B shows an example in which a current supply line 4810 is formed in parallel with the gate wiring 4803 and an erasing gate wiring 4811 is formed in parallel with the source wiring 4801. The current supply line 4810 and the gate wiring 4803 are formed so as not to overlap with each other in FIG. 14B. However, they may overlap with each other through an insulating film as long as the two are wirings formed in different layers. In this case, the current supply line 4810 and the gate wiring 4803 share their occupied areas to obtain even higher definition for the pixel section.

Note that it is possible to freely combine the constitution of the present embodiment with any constitution of Embodiments 1 to 10.

Embodiment 15

An EL display device according to the present invention may have any number of TFTs in a pixel. Though shown in Embodiments 13 and 14 are examples in each of which 3 TFTs are formed in a pixel, 4 to 6 TFTs may be provided. The present invention can be carried out without putting limitation to the pixel structure of the EL display device.

Note that it is possible to freely combine the constitution of the present embodiment with any of the constitution of Embodiments 1 to 10.

Embodiment 16

An EL display devices formed by executing the present invention can be utilized for a display section of various electric machines. For example, a display incorporating an EL display device of the present invention which has a diagonal 20 to 60 inches may be used for watching TV broadcasting etc. Note that the display incorporating an EL display device into the body includes all kinds of display for information display such as a display for personal computer, a display for receiving TV broadcasting, a display for displaying advertisements etc.

Following can be given as other electric machines of the present invention: video cameras; digital cameras; goggle type displays (head mounted displays); navigation systems; sound reproduction devices (car stereos, audio components etc.); notebook type personal computers; game machines; portable information terminals (mobile computers, portable telephones, portable game machines or electronic books, etc.); image reproduction devices (a device which incorporates a display section displaying an image by reproducing an image recorded in a recording medium), etc. Examples of these electric machines are shown in FIGS. 15A to 16B.

Figure 15A:
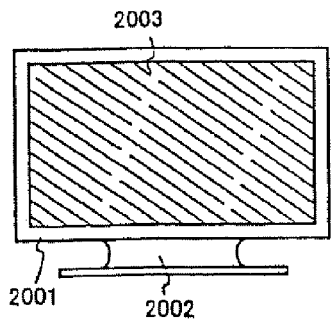
FIGS. 15A through 15F show specific examples of electronic apparatuses.

FIG. 15A is a display which incorporates an EL display device into the body, and comprises a body 2001, supporting arm 2002 and a display section 2003. The EL display device of the present invention can be used for the display section 2003. Because such display is spontaneous light emitting type back light is not required and a display section thinner than a liquid crystal display can be made.

Figure 15B:
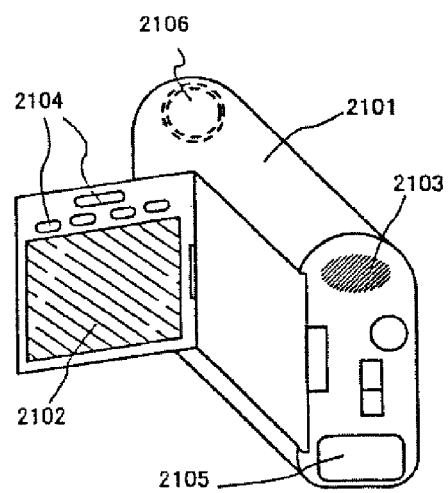

FIG. 15B is a video camera, and comprises: a main body 2101; display section 2102; a voice input section 2103; operation switches 2104; a battery 2105; and an image receiving section 2106. The EL display device of the present invention can be used in the display section 2102.

Figure 15C:
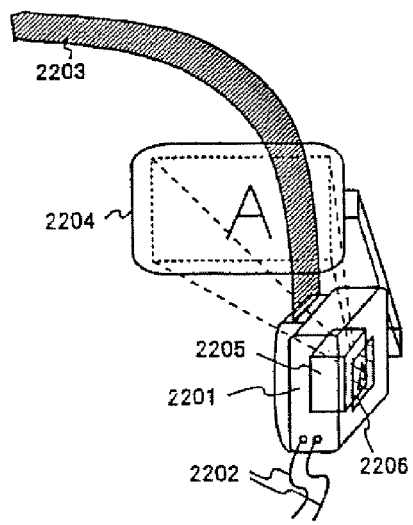

FIG. 15C is a part (right hand side) of head mounted type EL display and comprises: a main body 2201; signal cable 2202; head mounting band 2203; a display section 2204; optical system 2205; and an EL display device 2206. The present invention can be used in the EL display device 2206.

Figure 15D:
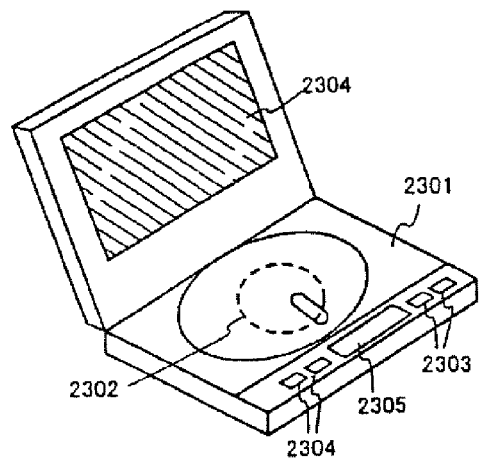

FIG. 15D is an image reproduction device (DVD reproduction device in concrete) incorporating a recording medium and comprises: a main body 2301; a recording medium (DVD etc.) 2302; operation switches 2303; a display section (a) 2304; and a display section (b) 2305. The display section (a) displays mainly image information, and the display section (b) displays mainly literal information. The EL display device of the present invention can be used in these display sections (a) and (b). Note that a home use game machines etc. are included in the image reproduction device incorporating a recording medium.

Figure 15E:
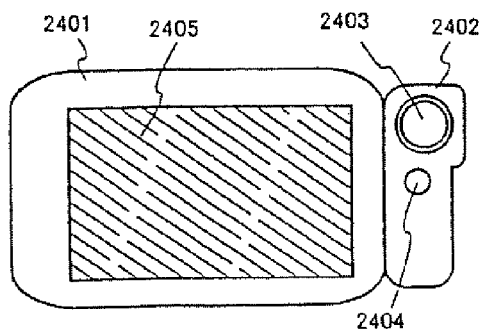

FIG. 15E is a mobile computer, and comprises: a main body 2401; a camera section 2402; an image receiving section 2403; operation switches 2404; and a display section 2405. The EL display device of the present invention can be used in the display section 2405.

Figure 15F:
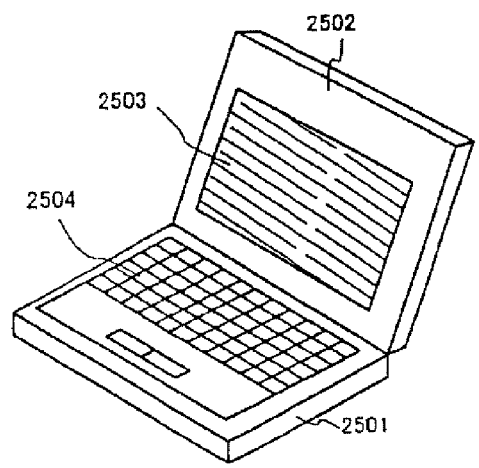

FIG. 15F is a personal computer and comprises: a main body 2501; a body 2502; a display section 2503; and a key board 2504. The EL display device of the present invention can be used in the display section 2503.

Note that the application to front type or rear type projector becomes possible by enlarging and projecting the light comprising output image information by lenses and optical fibers if the luminance of the light emittance further improves in future.

Since the parts where light is emitted consume electricity in the light emitting device, it is preferable to display information so as to minimize the light emitting parts as possible. Accordingly, specifically in case of using a light emitting device in the display section which mainly displays literal information such as a portable telephone or a sound reproduction device, it is preferable to drive so as to form the literal information by light emitting parts on the background of non-light emitting parts.

Figure 16A:
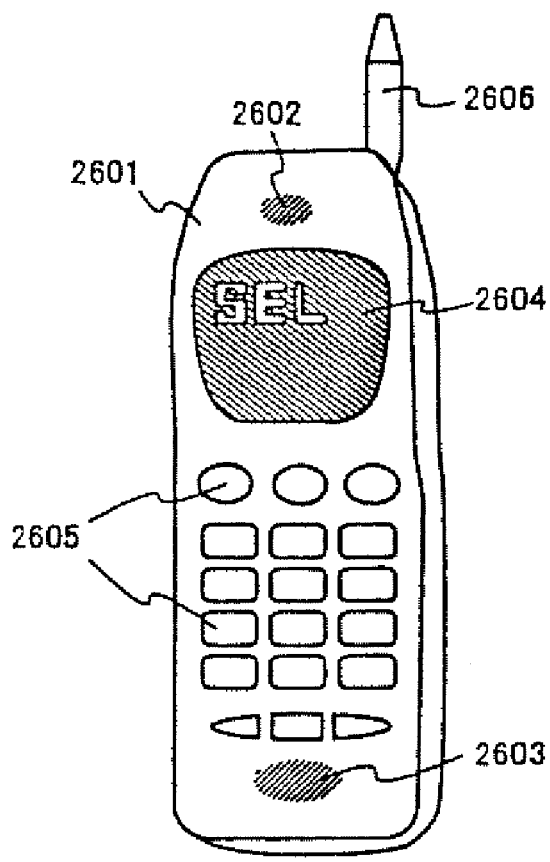
FIGS. 16A and 16B show specific examples of electronic apparatuses.

FIG. 16A is a portable telephone, and comprises: a main body 2601; a voice output section 2602; a voice input section 2603; a display section 2604; operation switches 2605; an antenna 2606. The EL display device of the present invention can be used in the display section 2604. Note that the display section 2604 can reduce electricity consumption of a portable telephone by displaying a white colored letters on a black colored background.

Figure 16B:
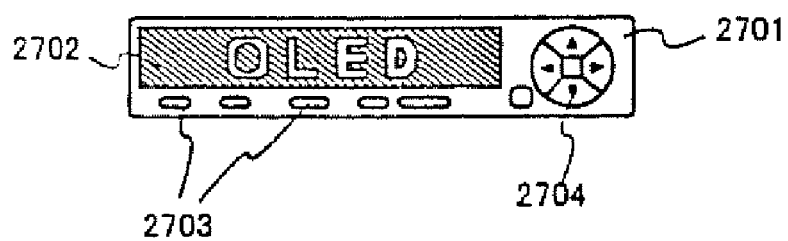

FIG. 16B is a sound reproduction device a car stereo in concrete, and comprises a main body 2701, a display section 2702, and operation switches 2703 and 2704. The EL display device of the present invention can be used in the display section 2702. Though the present embodiment shows a car stereo for mounting on a vehicle, it may be used for a sound reproduction device of portable type or a home use. Note that the display section 2702 can reduce electricity consumption of a portable telephone by displaying a white colored letters on a black colored background. This is specifically effective in a portable type sound reproduction device.

As described above, the applicable range of the present invention is very large, and it is possible to apply to electric machines of various areas. Further, the electric machines of the present embodiment may apply any constitution of EL device shown in Embodiments 1 to 15.

EFFECT OF THE INVENTION

By using this invention, it is possible to provide TFTs having appropriate characteristics in accordance with performance required for elements on the same insulator, and to provide high operating performance and reliability of the EL display device.

Concretely, it is possible to use separately a TFT oriented toward high operation speed and the TFT oriented toward low off-current on the same insulator. Accordingly, in the pixel of the EL display device, the switching TFT can obtain sufficient lower off-current, and the current control TFT can also obtain the sufficient lower off current by preventing from deterioration attributable to injection of hot carriers.

Furthermore, by using such an EL display device as a display device, it is possible to produce applied apparatus (electronic apparatus) having high durability (high quality).

What is claimed is:

1. An EL display device comprising:
   a first thin film transistor comprising:
      at least two channel forming regions; and
      an LDD (lightly-doped drain) region between the two channel forming regions wherein the LDD region partially overlaps a gate electrode of the first thin film transistor with a gate insulating film interposed therebetween;
   a second thin film transistor electrically connected to the first thin film transistor, comprising:
      a third channel region; and
      an impurity region partially overlapping a gate electrode of the second thin film transistor with the gate insulating film interposed therebetween, and
   an EL element electrically connected to the second thin film transistor.

2. The EL display device according to claim 1, wherein an active layer of the first thin film transistor is a monocrystalline semiconductor film.

3. The EL display device according to claim 1, wherein the impurity region is an LDD region.

4. The EL display device according to claim 1, wherein the EL display device is driven by using an analog signal.

5. The EL display device according to claim 1, wherein the EL display device is incorporated into a display, wherein the display is at least one selected from the group consisting of a personal computer, a display for receiving TV broadcasting and a display for displaying advertisements.

6. The EL display device according to claim 1, wherein a display incorporating the EL display device has a diagonal 20 to 60 inches.

7. An EL display device comprising:
   a first thin film transistor comprising:
      at least two channel forming regions; and
      an LDD region between the two channel forming regions wherein the LDD region is formed in a region which does not overlap a gate electrode of the first thin film transistor;
   a second thin film transistor electrically connected to the first thin film transistor, comprising:
      a third channel region; and
      an impurity region partially overlapping a gate electrode of the second thin film transistor with a gate insulating film interposed therebetween, and
   an EL element electrically connected to the second thin film transistor.

8. The EL display device according to claim 7, wherein an active layer of the first thin film transistor is a monocrystalline semiconductor film.

9. The EL display device according to claim 7, wherein the impurity region is an LDD region.

10. The EL display device according to claim 7, wherein the EL display device is driven by using an analog signal.

11. The EL display device according to claim 7, wherein the EL display device is incorporated into a display, wherein the display is at least one selected from the group consisting of a personal computer, a display for receiving TV broadcasting and a display for displaying advertisements.

12. The EL display device according to claim 7, wherein a display incorporating the EL display device has a diagonal 20 to 60 inches.

13. An EL display device comprising:
   a first thin film transistor comprising:
      a first island-shaped semiconductor film;
      a gate insulating film formed over the first island-shaped semiconductor film;
      a first gate electrode formed over the first island-shaped semiconductor film with the gate insulating film interposed therebetween; and
      a second gate electrode formed over the first island-shaped semiconductor film with the gate insulating film interposed therebetween;
   a second thin film transistor electrically connected to the first thin film transistor, comprising:
      a second island-shaped semiconductor film; and
      a third gate electrode formed over the second island-shaped semiconductor film with the gate insulating film interposed therebetween; and
   an EL element electrically connected to the second thin film transistor,
   wherein the first island-shaped semiconductor film comprises:
      a first pair of LDD regions partially overlapping the first gate electrode with the gate insulating film interposed therebetween;
      a first channel forming region between the first pair of LDD regions and overlapping the first gate electrode with the gate insulating film interposed therebetween;

a second pair of LDD regions partially overlapping the second gate electrode with the gate insulating film interposed therebetween; and a second channel forming region between the second pair of LDD regions and overlapping the second gate electrode with the gate insulating film interposed therebetween, and wherein the second island-shaped semiconductor film comprises:

a third channel forming region overlapping the third gate electrode with the gate insulating film interposed therebetween; and an impurity region adjacent to the third channel forming region wherein the impurity region partially overlaps the third gate electrode with the gate insulating film interposed therebetween.

14. The EL display device according to claim 13, wherein an active layer of the first thin film transistor is a monocrystalline semiconductor film.

15. The EL display device according to claim 13, wherein the impurity region is an LDD region.

16. The EL display device according to claim 13, wherein the EL display device is driven by using an analog signal.

17. The EL display device according to claim 13, wherein the EL display device is incorporated into a display, wherein the display is at least one selected from the group consisting of a personal computer, a display for receiving TV broadcasting and a display for displaying advertisements.

18. The EL display device according to claim 13, wherein a display incorporating the EL display device has a diagonal 20 to 60 inches.

19. An EL display device comprising:
a first thin film transistor comprising:
   a first island-shaped semiconductor film;
   a gate insulating film formed over the first island-shaped semiconductor film;
   a first gate electrode formed over the first island-shaped semiconductor film with the gate insulating film interposed therebetween; and
   a second gate electrode formed over the first island-shaped semiconductor film with the gate insulating film interposed therebetween;
a second thin film transistor electrically connected to the first thin film transistor, comprising:
   a second island-shaped semiconductor film; and
   a third gate electrode formed over the second island-shaped semiconductor film with the gate insulating film interposed therebetween; and
an EL element electrically connected to the second thin film transistor,
wherein the first island-shaped semiconductor film comprises:
   a first pair of LDD regions formed in a region which does not overlap with the first gate electrode;
   a first channel forming region between the first pair of LDD regions and overlapping the first gate electrode with the gate insulating film interposed therebetween;
   a second pair of LDD regions formed in a region which does not overlap the second gate electrode with the gate insulating film interposed therebetween, and
   a second channel forming region between the second pair of LDD regions and overlapping the second gate electrode with the gate insulating film interposed therebetween, and
wherein the second island-shaped semiconductor film comprises:
   a third channel forming region overlapping the third gate electrode with the gate insulating film interposed therebetween; and
   an impurity region adjacent to the third channel forming region wherein the impurity region partially overlaps the third gate electrode with the gate insulating film interposed therebetween.

20. The EL display device according to claim 19, wherein an active layer of the first thin film transistor is a monocrystalline semiconductor film.

21. The EL display device according to claim 19, wherein the impurity region is an LDD region.

22. The EL display device according to claim 19, wherein the EL display device is driven by using an analog signal.

23. The EL display device according to claim 19, wherein the EL display device is incorporated into a display, wherein the display is at least one selected from the group consisting of a personal computer, a display for receiving TV broadcasting and a display for displaying advertisements.

24. The EL display device according to claim 19, wherein a display incorporating the EL display device has a diagonal 20 to 60 inches.

* * * * *